US008693226B2

(12) United States Patent
Kitabatake et al.

(10) Patent No.: US 8,693,226 B2
(45) Date of Patent: *Apr. 8, 2014

(54) SYNCHRONOUS RECTIFICATION TYPE INVERTER

(75) Inventors: Makoto Kitabatake, Nara (JP); Shun Kazama, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/639,182

(22) PCT Filed: Oct. 28, 2011

(86) PCT No.: PCT/JP2011/006064
§ 371 (c)(1),
(2), (4) Date: Oct. 3, 2012

(87) PCT Pub. No.: WO2012/056720
PCT Pub. Date: May 3, 2012

(65) Prior Publication Data
US 2013/0021831 A1  Jan. 24, 2013

(30) Foreign Application Priority Data
Oct. 29, 2010 (JP) .................................. 2010-243971

(51) Int. Cl.
H02M 3/335 (2006.01)
(52) U.S. Cl.
USPC ................................. 363/80; 363/89; 363/127
(58) Field of Classification Search
USPC ............ 323/222, 224, 266, 282, 284; 363/78, 363/80, 84, 89, 90, 125, 127
See application file for complete search history.

(56) References Cited

U.S. PATENT DOCUMENTS

| 4,760,035 A | 7/1988 | Pfleiderer et al. |
| 5,907,481 A | 5/1999 | Svardsjo |

(Continued)

FOREIGN PATENT DOCUMENTS

| CN | 1641887 | 7/2005 |
| CN | 101512902 | 8/2009 |

(Continued)

OTHER PUBLICATIONS

International Search Report issued Jan. 17, 2012 in International (PCT) Application No. PCT/JP2011/006064.

(Continued)

Primary Examiner — Adolf Berhane
Assistant Examiner — Lakaisha Jackson
(74) Attorney, Agent, or Firm — Wenderoth, Lind & Ponack, L.L.P.

(57) ABSTRACT

An inverter comprising: a circuit including arms connected in parallel, each of the arms including a first switch and a second switch connected in series; and a gate drive circuit configured to control, by pulse-width modulation using synchronous rectification, each of the first switch and the second switch to switch to an on-state or an off-state, wherein each of the first switch and the second switch includes: a channel region that is conductive in both a forward direction and a reverse direction in the on-state, and that is not conductive in the forward direction in the off-state; and a diode region that is combined as one with the channel region, and that is conductive only in the reverse direction, the diode region being unipolar, and the gate drive circuit synchronizes a timing at which the gate drive circuit outputs a signal for causing the first switch to switch to the on-state with a timing at which the gate drive circuit outputs a signal for causing the second switch to switch to the off-state, and synchronizes a timing at which the gate drive circuit outputs a signal for causing the first switch to switch to the off-state with a timing at which the gate drive circuit outputs a signal for causing the second switch to switch to the on-state.

10 Claims, 27 Drawing Sheets

(56) References Cited

U.S. PATENT DOCUMENTS

| | | |
|---|---|---|
| 6,288,920 B1 | 9/2001 | Jacobs et al. |
| 6,344,768 B1 | 2/2002 | Daun-Lindberg et al. |
| 7,148,670 B2 | 12/2006 | Inn et al. |
| 7,596,009 B2 | 9/2009 | Matsumoto |
| 8,014,177 B2 | 9/2011 | Nishikawa |
| 8,350,549 B2 * | 1/2013 | Kitabatake .................. 323/282 |
| 2004/0207372 A1 * | 10/2004 | Yoshikawa .................. 323/282 |
| 2005/0156204 A1 | 7/2005 | Uno et al. |
| 2006/0249806 A1 | 11/2006 | Shirai et al. |
| 2007/0040471 A1 | 2/2007 | Ollila |
| 2008/0121993 A1 | 5/2008 | Hefner et al. |
| 2009/0039394 A1 | 2/2009 | Uno et al. |
| 2009/0161391 A1 | 6/2009 | Matsumoto |
| 2009/0256618 A1 | 10/2009 | Yamawaki et al. |
| 2009/0321784 A1 | 12/2009 | Anderson et al. |
| 2010/0090271 A1 | 4/2010 | Hefner et al. |
| 2010/0135053 A1 | 6/2010 | Morimoto et al. |
| 2011/0063877 A1 | 3/2011 | Yang et al. |
| 2011/0227169 A1 | 9/2011 | Uno et al. |
| 2011/0273154 A1 * | 11/2011 | Satou et al. .................. 323/282 |

FOREIGN PATENT DOCUMENTS

| | | |
|---|---|---|
| EP | 1 227 588 | 7/2002 |
| JP | 57-103355 | 6/1982 |
| JP | 3-110867 | 5/1991 |
| JP | 5-243945 | 9/1993 |
| JP | 8-148675 | 6/1996 |
| JP | 9-154276 | 6/1997 |
| JP | 2000-68039 | 3/2000 |
| JP | 2001-145369 | 5/2001 |
| JP | 2001-186780 | 7/2001 |
| JP | 2002-299625 | 10/2002 |
| JP | 2003-17701 | 1/2003 |
| JP | 2004-215357 | 7/2004 |
| JP | 2004-349327 | 12/2004 |
| JP | 2005-110440 | 4/2005 |
| JP | 2005-341769 | 12/2005 |
| JP | 2008-17237 | 1/2008 |
| JP | 2008-61403 | 3/2008 |
| JP | 4197400 | 12/2008 |
| JP | 2009-148106 | 7/2009 |
| JP | 2009-159696 | 7/2009 |
| JP | 2010-509771 | 3/2010 |
| JP | 2010-205834 | 9/2010 |
| WO | 2011/033550 | 3/2011 |

OTHER PUBLICATIONS

International Search Report issued Jan. 17, 2012 in International (PCT) Application No. PCT/JP2011/006063.

H. Lendenmann et al., "High-Power SiC Diodes: Characteristics, Reliability and Relation to Material Defects", Materials Science Forum, vols. 389-393, pp. 1259-1264 (2002).

J.P. Bergman et al., "Crystal Defects as Source of Anomalous Forward Voltage Increase of 4H-SiC Diodes" Materials Science Forum, vols. 353-356, pp. 299-302 (2001).

International Preliminary Report on Patentability issued May 14, 2012 in International (PCT) Application No. PCT/JP2011/006064.

Notice of Allowance and Notice of Allowability of Sep. 12, 2012 in U.S. Appl. No. 13/510,412.

Chinese Office Action (along with partial translation) issued Sep. 23, 2013 in Chinese Application No. 201180022019.0.

Supplementary European Search Report issued Oct. 8, 2013 in European Application No. 11835863.9.

* cited by examiner

FIG. 4A
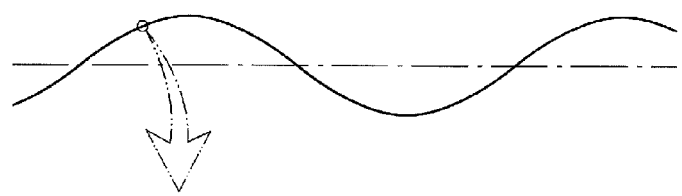
FIG. 4B
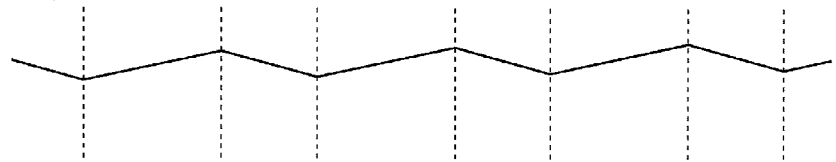
  Pw — High level / Low level
  SgH1 — High level / Low level
  SgL1 — High level / Low level
  IH1
FIG. 4G
  IL1
  ID1

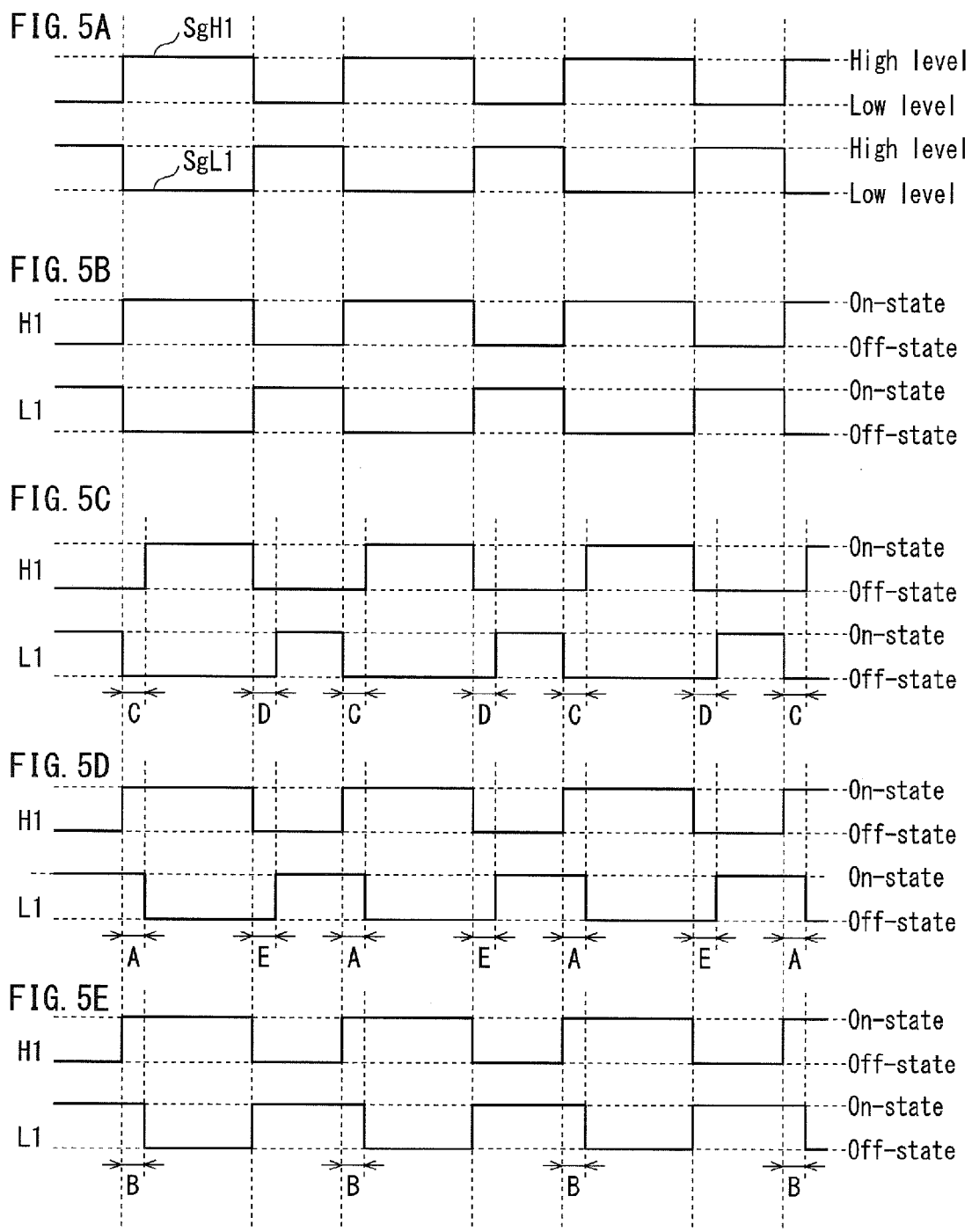

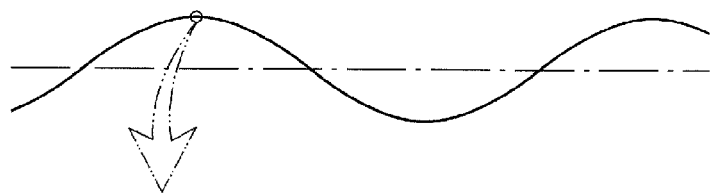

Forward direction
(Vds=20V, Vg=0, 1, 2, 3, 4V)

Reverse direction
(Vgs=0V, Vds=-2.0, -1.5, -1.0, -0.5, 0V)

Second Embodiment

Comparative example

To three-phase AC motor

Threshold value

Transition period from off-state to on-state

Transition period from on-state to off-state

SYNCHRONOUS RECTIFICATION TYPE INVERTER

TECHNICAL FIELD

The present invention relates to technology for simplifying the structure of an inverter utilizing synchronous rectification, especially the structure of a gate drive circuit in the inverter.

BACKGROUND ART

There is a conventional inverter utilizing synchronous rectification, that is, an inverter that performs a rectification process by synchronizing the operation of a rectifier switch (rectifier element) with the operation of a main switch (for example, Patent Literature 1). Such an inverter utilizing synchronous rectification brings about the advantage that the power conversion efficiency can be improved by causing the rectifier switch to operate with a voltage lower than the on-voltage for a freewheeling diode. Note, the on-voltage for the freewheeling diode is a voltage required to turn on the freewheeling diode.

FIG. 26 shows an overall structure of a load driving system that includes an inverter utilizing synchronous rectification.

A load driving system 900 includes a direct current power supply DC, a smoothing capacitor 902, an inverter 901, and a three-phase alternating current (AC) motor 903 as the load.

The inverter 901 has a three-phase bridge circuit composed of a U-phase arm 904u, a V-phase arm 904v and a W-phase arm 904w, which are connected in parallel. The inverter 901 also has a gate drive circuits GD 91 and GD 92, which control switching operations by switches included in each arm.

Since the arms 904u, 904v and 904w have the same structure, the following describes the W-phase arm 904w only. The W-phase arm 904w includes a high-side switch H9 and a low-side switch L9, which are connected in series. In order to achieve synchronous rectification, the switches H9 and L9 are each constituted by a power semiconductor element with a channel region that is conductive in both forward and reverse directions in the on-state. A representative example of such a power semiconductor element is a metal-oxide-semiconductor field-effect transistor (MOSFET).

A gate terminal of the switch H9 and a gate terminal of the switch L9 are respectively connected to the gate drive circuits GD91 and GD92. The operations of the switches H9 and L9 are controlled due to gate drive signals SgH9 and SgL9, which are output from the gate drive circuits GD91 and GD92, being input to the gate terminals of the switches H9 and L9.

A freewheeling diode DH9 is connected antiparallel between the source and the drain of the high-side switch H9, so that the input/output direction of the freewheeling diode DH9 is the reverse of the input/output direction of the high-side switch H9. In a similar manner, a freewheeling diode DL9 is connected antiparallel between the source and the drain of the low-side switch L9. The freewheeling diodes DH9 and DL9 are provided to secure a path through which a current freewheels when, for example, both of the switches H9 and L9 are in the off-state. Patent Literature 1 discloses a technique in which a bipolar diode region that is conductive only in the reverse direction is used as a freewheeling diode DL9. Note, such a bipolar diode region inherently exists in the structure of MOSFET that constitutes a switch. This structure does not require providing a diode separately from the MOSFET, and therefore offers the advantageous effect of reducing the size of each switch. Such a bipolar diode region that inherently exists in the structure of MOSFET is also referred to as a body diode or a parasitic diode.

CITATION LIST

Patent Literature

[Patent Literature 1]
JP Patent Application Publication No. 2008-061403
[Patent Literature 2]
JP Patent Application Publication No. 2002-299625
[Patent Literature 3]
JP Patent Application Publication No. 2008-017237

Non-Patent Literature

[Non-Patent Literature 1]
H. Lendenmann et al., Materials Science Forum, 389-393, 1259 (2002)
[Non-Patent Literature 2]
J. P. Bergman, et al., Materials Science Forum, 353-356, 299 (2001)

SUMMARY OF INVENTION

Technical Problem

FIGS. 27A through 27D show a timing chart of the inverter 901 included in the load driving system 900 during operation. In the timing chart, only the operations by the switches H9 and L9 included in the W-phase arm 904w shown in FIG. 26 are depicted.

FIG. 27A shows a waveform of the current ouput by the W-phase arm 904w. FIG. 27B is an enlarged view of the portion within the circle depicted in FIG. 27A. When synchronous rectification is used, the high-side switch H9 serves as the main switch and the low-side switch L9 serves as the rectifier switch within the period of a positive half-cycle shown in FIG. 27A (which includes the portion within the circle). On the otherhand, within the period of a negative half-cycle, the low-side switch L9 servers as the main switch ans the high-side switch H9 serves as the rectifier switch. The following describes the case of the positive half-cycle unless otherwise noted.

FIG. 27C shows a voltage waveform of the gate drive signal SgH9, and FIG. 27D shows a voltage waveform of the gate drive signal SgL9. In a time period where the gate drive signal SgH9 is at a high level, the high-side switch H9 is in the on-state, whereas in a time period where the gate drive signal SgH9 is at a low level, the high-side switch H9 is in the off-state. Similarly, in a time period where the gate drive signal SgL9 is at a high level, the low-side switch L9 is in the on-state, whereas in a time period where the gate drive signal SgL9 is at a low level, the low-side switch L9 is in the off-state.

Conventionally, the gate drive signals SgH9 and SgL9 are provided with dead times DT1 and DT2 as shown in FIGS. 27C and 27D. This is for preventing the flow of a short circuit current, which is caused by placing both of the switches H9 and L9 in the on-state. As such, the gate drive circuits GD91 and GD92 must be configured to receive pulse-width modulation signals input from the outside (hereinafter referred to as "PWM signal(s)") and generate the gate drive signals SgH9 and SgL9 provided with the dead times DT1 and DT2 based on the received PWM signals. This gives rise to the problem that the structure of the gate drive circuits is complicated.

The present invention has been conceived in view of the above problem, and aims to provide an inverter that can prevent a short circuit current from flowing between a high-side switch and a low-side switch and that can simplify the structure of a gate drive circuit.

Solution to Problem

To achieve the above aim, the present description discloses an inverter comprising: a circuit including N arms connected in parallel, N being an integer equal to or greater than two, each of the N arms including a first switch and a second switch connected in series, each of the first switch and the second switch including a gate for controlling a switching operation; and N gate drive circuits corresponding one-to-one to the N arms and configured to control, by pulse-width modulation using synchronous rectification, each of the first switch and the second switch to switch to an on-state or an off-state, wherein each of the first switch and the second switch includes: a channel region that is conductive in both a forward direction and a reverse direction in the on-state, and that is not conductive in the forward direction in the off-state; and a diode region that is combined as one with the channel region, and that is conductive only in the reverse direction, the diode region being unipolar, and the gate drive circuit synchronizes a timing at which the gate drive circuit outputs a signal for causing the first switch to switch to the on-state with a timing at which the gate drive circuit outputs a signal for causing the second switch to switch to the off-state, and synchronizes a timing at which the gate drive circuit outputs a signal for causing the first switch to switch to the off-state with a timing at which the gate drive circuit outputs a signal for causing the second switch to switch to the on-state.

Advantageous Effects of Invention

With the structure of an inverter disclosed in the present description, the switches include a channel region that is conductive in both forward and reverse directions. Synchronous rectification can be performed with use of such switches.

The switches also include a diode region that is conductive only in the reverse direction. This way, the switches can function as freewheeling diodes. The switching speed is faster with a unipolar diode region than with a bipolar diode region. In addition, a unipolar diode region brings about a smaller degree of voltage drop in the forward direction than a bipolar diode regions does. Therefore, the inverter disclosed in the present description can reduce switching losses. As described above, it is commonly known that a short circuit current flows when both switches, which are connected in series to each other, are in the on-state. However, through diligent studies, the inventors of the present application have found that a short circuit current does not flow if a time period in which both switches are in the on-state falls within a predetermined time period. This "predetermined time period" in which the short circuit current does not flow exists because wiring between the direct current power supply and the inverter has parasitic inductance.

The gate drive circuit included in the inverter disclosed in the present description controls the first switch and the second switch so as to synchronize a timing at which the gate drive circuit outputs a signal for the switching operation of the first switch with a timing at which the gate drive circuit outputs a signal for the switching operation of the second switch. Hence, the gate drive circuit does not require a structure for generating gate drive signals with dead times.

Here, the expression "synchronize a timing at which the gate drive circuit outputs a signal for the switching operation of the first switch with a timing at which the gate drive circuit outputs a signal for the switching operation of the second switch" means that in terms of waveforms of command signals output from the gate drive circuit to the first and second switches, a timing at which the first switch performs a switching operation matches a timing at which the second switch performs a switching operation. However, even when these timings match in terms of waveforms of command signals output to the first and second switches, there are still cases where a timing at which the first switch actually performs a switching operation does not match a timing at which the second switch actually performs a switching operation. This is attributed to various causes, such as variations in delay in transmission of command signals from the gate drive circuit to the first and second switches, and variations in threshold values of the first and second switches. The above expression encompasses both of the following cases: a case where a timing at which the first switch actually performs a switching operation matches a timing at which the second switch actually performs a switching operation; and a case where a timing at which the first switch actually performs a switching operation does not match a timing at which the second switch actually performs a switching operation, while a time period in which both switches are in the on-state falls within the above "predetermined time period."

In addition, even when no dead time is provided in the gate drive signals, the aforementioned causes may bring about a time period in which both of the first and second switches are in the off-state while the first and second switches are actually driven. Provided that a bipolar diode is used, if there are any time periods in which both switches are in the off-state, a recovery current flows due to a so-called minority carrier storage effect. A time period in which the recovery current flows is a time period in which both switches are in the on-state. Therefore, when the time period in which the recovery current flows exceeds the aforementioned "predetermined time period," it means that the time period in which both switches are in the on-state exceeds the "predetermined time period," with the result that a short circuit current flows between the switches.

However, in the present invention, the diode region is unipolar. This way, there is hardly any time period in which the recovery current flows due to the minority carrier storage effect, even if there are time periods in which both switches are in the off-state. As a result, the time period in which the recovery current flows does not exceed the aforementioned "predetermined time period", thus preventing the flow of the short circuit current.

As set forth above, the present invention can provide an inverter that can prevent a short circuit current from flowing between a high-side switch and a low-side switch and that can simplify the structure of a gate drive circuit.

BRIEF DESCRIPTION OF DRAWINGS

FIGS. 4A through 4I show a timing chart of the inverter 101 pertaining to First Embodiment during operation.

FIGS. 5A through 5E show a timing chart in which voltage waveforms of gate drive signals SgH1 and SgL1 are depicted in correspondence with the states of the switches H1 and L1.

FIGS. 8A through 8J show a timing chart obtained in a case where there are time periods in which both of the switches H1 and L1 pertaining to First Embodiment are in the off-state.

FIGS. 27A through 27D show a timing chart of an inverter 901 included in a load driving system 900 during operation.

DESCRIPTION OF EMBODIMENTS

The following describes embodiments of the present invention with reference to the drawings.

First Embodiment

<Overall Structure>

Figure 1:
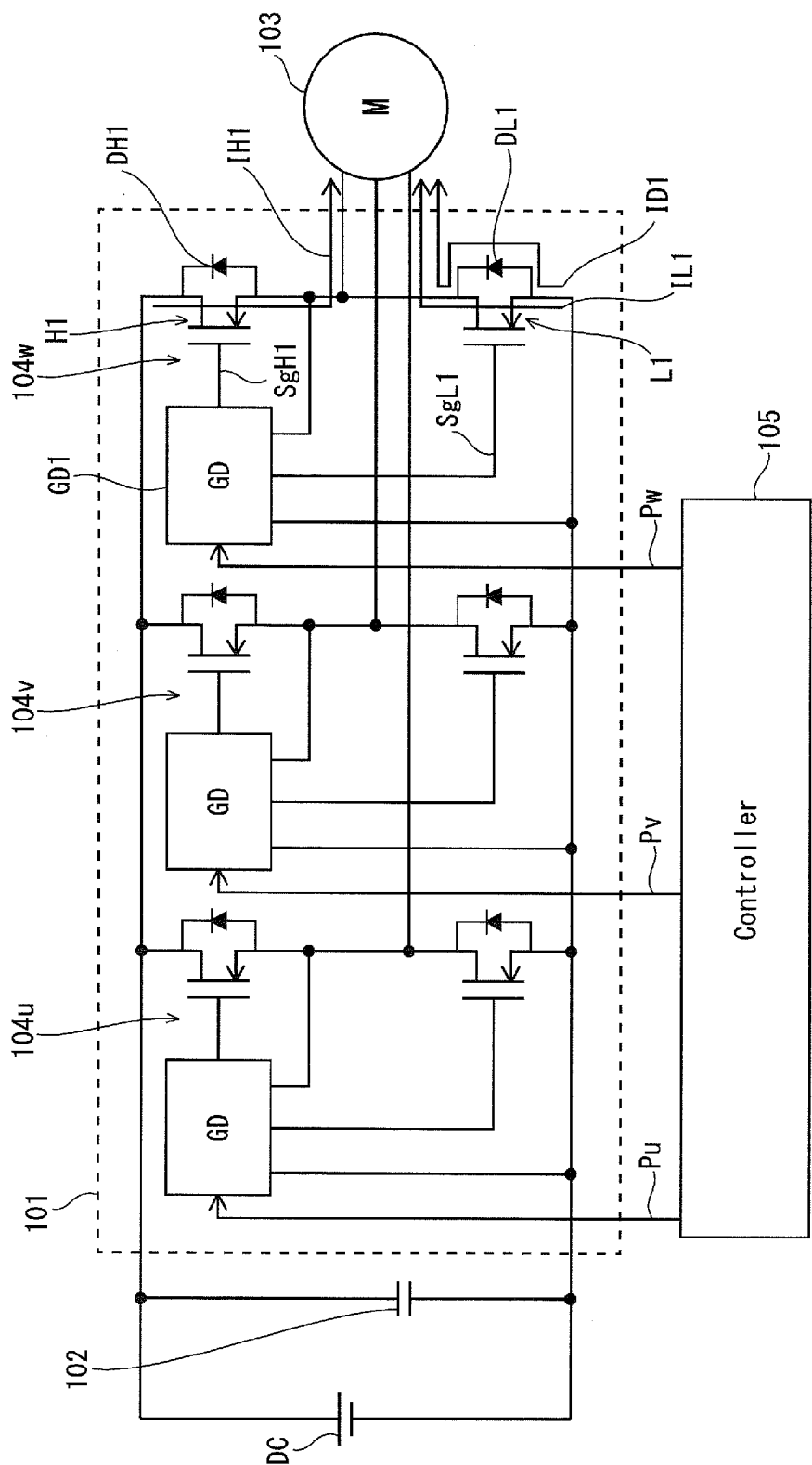
FIG. 1 shows an overall structure of a load driving system 100 including an inverter 101 pertaining to First Embodiment.

FIG. 1 shows an overall structure of a load driving system 100 including an inverter pertaining to First Embodiment. The present embodiment describes a structure in which a three-phase AC motor serves as the load.

The load driving system 100 includes a direct current power supply DC, an inverter 101, a smoothing capacitor 102, a three-phase AC motor 103, and a controller 105.

For example, the direct current power supply DC may obtain a direct current by rectifying a power supply system. Alternatively, the direct current power supply DC may be in the form of a battery (representative examples include secondary batteries such as a nickel-metal hydride battery and a lithium-ion battery).

The inverter 101 converts a direct current supplied from the direct current power supply DC into a three-phase alternating current, and supplies the three-phase alternating current to the three-phase AC motor 103. The three phases, namely a U phase, a V phase and a W phase, are out of phase with each other by 120° ($2\pi/3$ radians). The inverter 101 has a three-phase bridge circuit and a gate drive circuit GD1. The three-phase bridge circuit is composed of a U-phase arm 104$u$, a V-phase arm 104$v$ and a W-phase arm 104$w$, which are connected in parallel.

Since the structures of the arms 104$u$, 104$v$ and 104$w$ are the same, the following only describes the W-phase arm 104$w$. The W-phase arm 104 is composed of a high-side switch H1 and a low-side switch L1, which are connected in series. In order to achieve synchronous rectification, the switches H1 and L1 are each constituted by a power semiconductor element with a channel region that is conductive in both forward and reverse directions in the on-state. Each of the switches H1 and L1 has a unipolar diode region that is conductive only in the reverse direction. The unipolar diode regions in the switches H1 and L1 function as freewheeling diodes DH1 and DL1. As these diode regions pertaining to the present embodiment are unipolar, their switching speed is faster than the switching speed of bipolar diode regions in the forward direction, and they bring about a smaller degree of voltage drop in the forward direction than the bipolar diode regions do. As such, compared to conventional diode regions, the diode regions pertaining to the present embodiment have a fast switching speed and small conduction losses. Accordingly, the diode regions pertaining to the present embodiment can improve the power conversion efficiency. The power conversion efficiency is particularly important in devices using high-frequencies, such as inverters. Furthermore, with the smaller degree of voltage drop in the forward direction, the diode regions pertaining to the present embodiment contribute not only to improvement in the power conversion efficiency, but also to suppression of heat generation when they function as freewheeling diodes.

Figure 26:
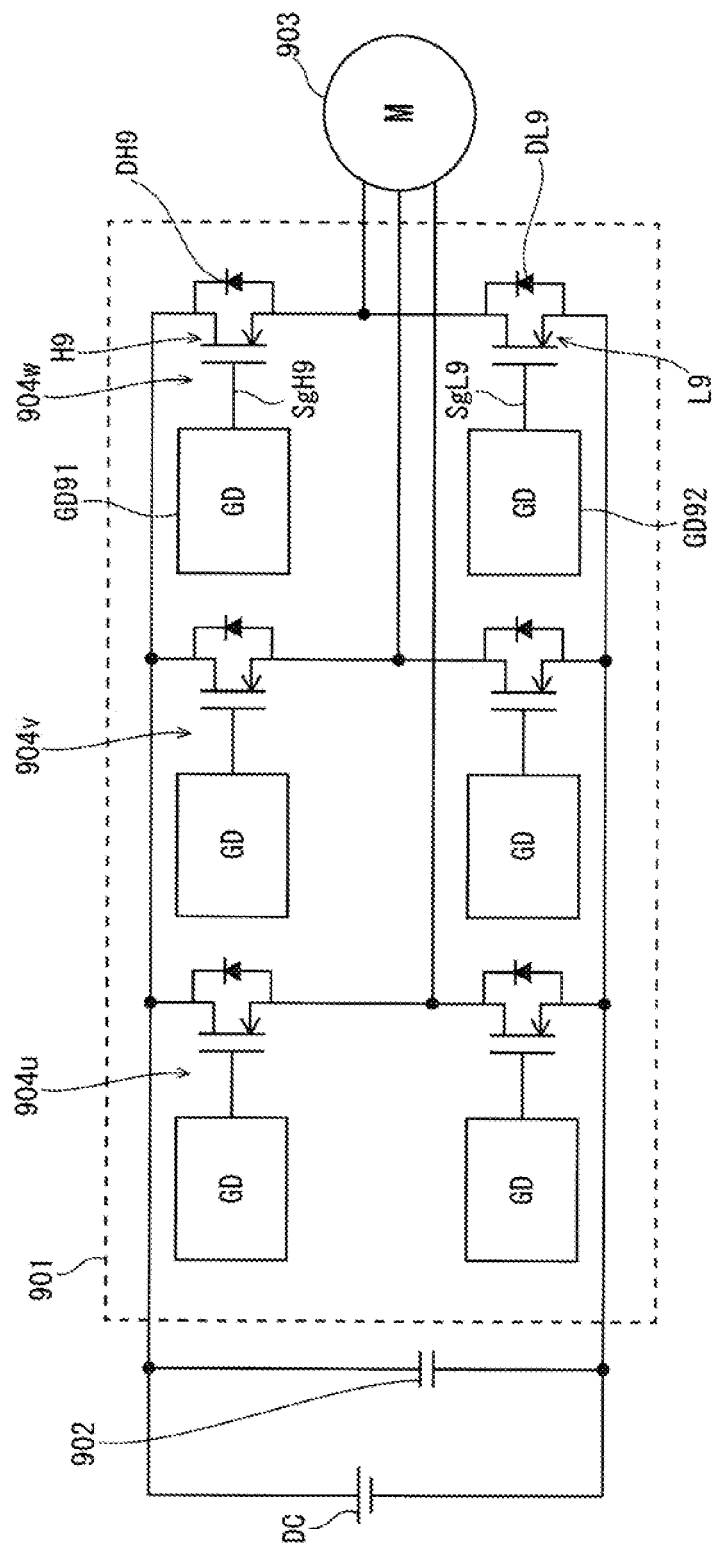
FIG. 26 shows an overall structure of a load driving system that includes an inverter utilizing synchronous rectification.
Figure 27A:
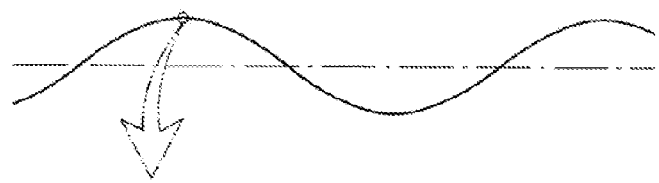
Figure 27B:
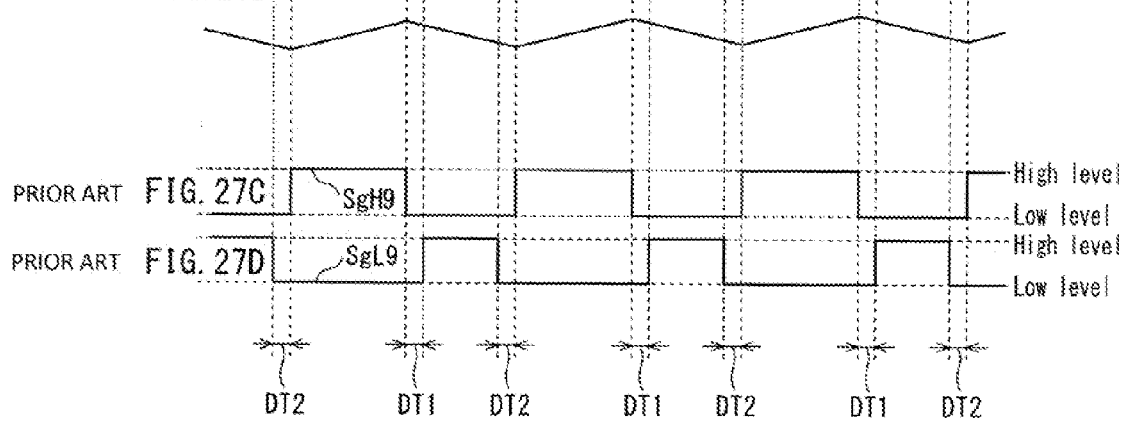

Since the structures of the arms 104$u$, 104$v$ and 104$w$ are the same as the structures of the arms 904$u$, 904$v$ and 904$w$ shown in FIG. 26, their explanations are omitted in the following.

Figure 2:
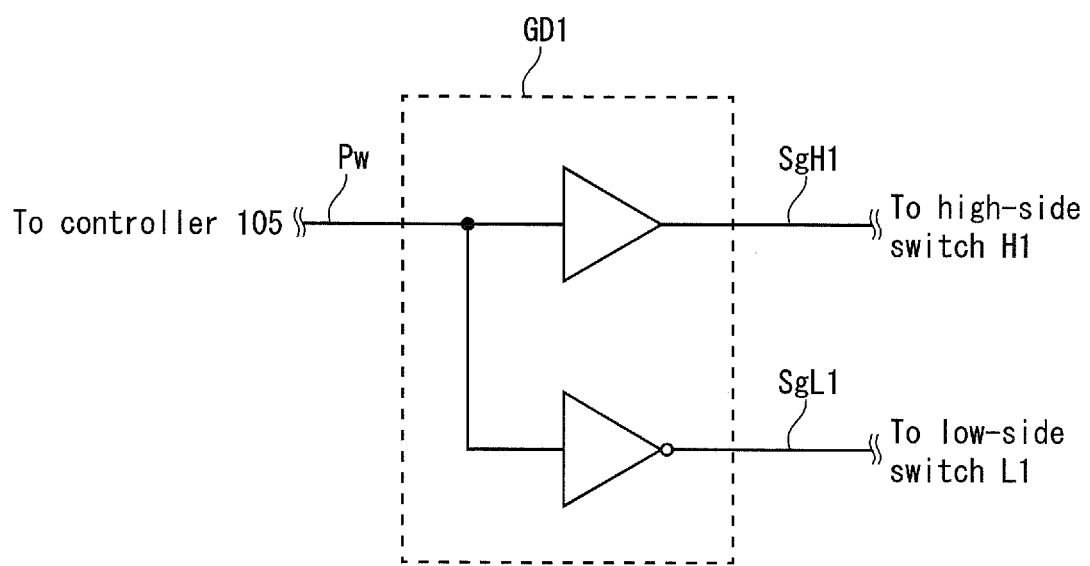
FIG. 2 schematically shows a circuit structure of a gate drive circuit GD1 pertaining to First Embodiment.

The gate drive circuit GD1 controls the switching operations of the switches H1 and L1 so as to perform synchronous rectification based on pulse-width modulation by using a switch that is reverse-biased. FIG. 2 schematically shows a circuit structure of the gate drive circuit GD1. Based on an input PWM signal Pw, the gate drive circuit GD1 generates a gate drive signal SgH1, which is a command signal to be output to the gate terminal of the high-side switch H1. The gate drive circuit GD1 also generates a gate drive signal SgL1, which is to be output to the low-side switch L1, by reversing the waveform of the PWM signal Pw. That is to say, the gate drive circuit GD1 generates two gate drive signals SgH1 and SgL1 based on a single input signal (in the present embodiment, the PWM signal Pw). Timings of the operations of the switches H1 and L1 are controlled by outputting these gate drive signals SgH1 and SgL1 to the gate terminals of the switches H1 and L1.

Although not given reference signs in FIG. 1, the U-phase gate drive circuit and the V-phase gate drive circuit perform, for the U phase and the V phase, respectively, the same operations as the W-phase gate drive circuit GD1.

The smoothing capacitor 102 is provided to suppress fluctuations in the internal voltage of the load driving system 100.

The three-phase AC motor 103 is composed of a three-phase winding to which the three-phase alternating current is supplied.

The controller 105 generates a command signal to be output to the gate drive circuit GD1. More specifically, in the case of the W phase, the controller 105 obtains the PWM signal Pw by comparing a carrier signal with a control command signal having a sinusoidal waveform, and outputs the PWM signal Pw to the gate drive circuit GD1 as a command signal. With use of the PWM signal Pw generated in the above manner, the inverter 101 pertaining to the present embodiment is not a zero-current-switching inverter. Thus, in the buck converter 104 pertaining to the present embodiment, the switches are turned on/off when the current flowing through the switches has a finite current value other than 0 A. Furthermore, the frequency of the alternating current output by the inverter 101 is different from the frequency of the carrier signal. Note, zero-current-switching is a switching technique that turns on/off the switches when the current flowing through the switches equals 0 A. The controller 105 outputs a PWM signal Pu and a PWM signal Pv to the U-phase gate drive circuit and the V-phase gate drive circuit, respectively.

<Structure of Switches>

Figure 3:
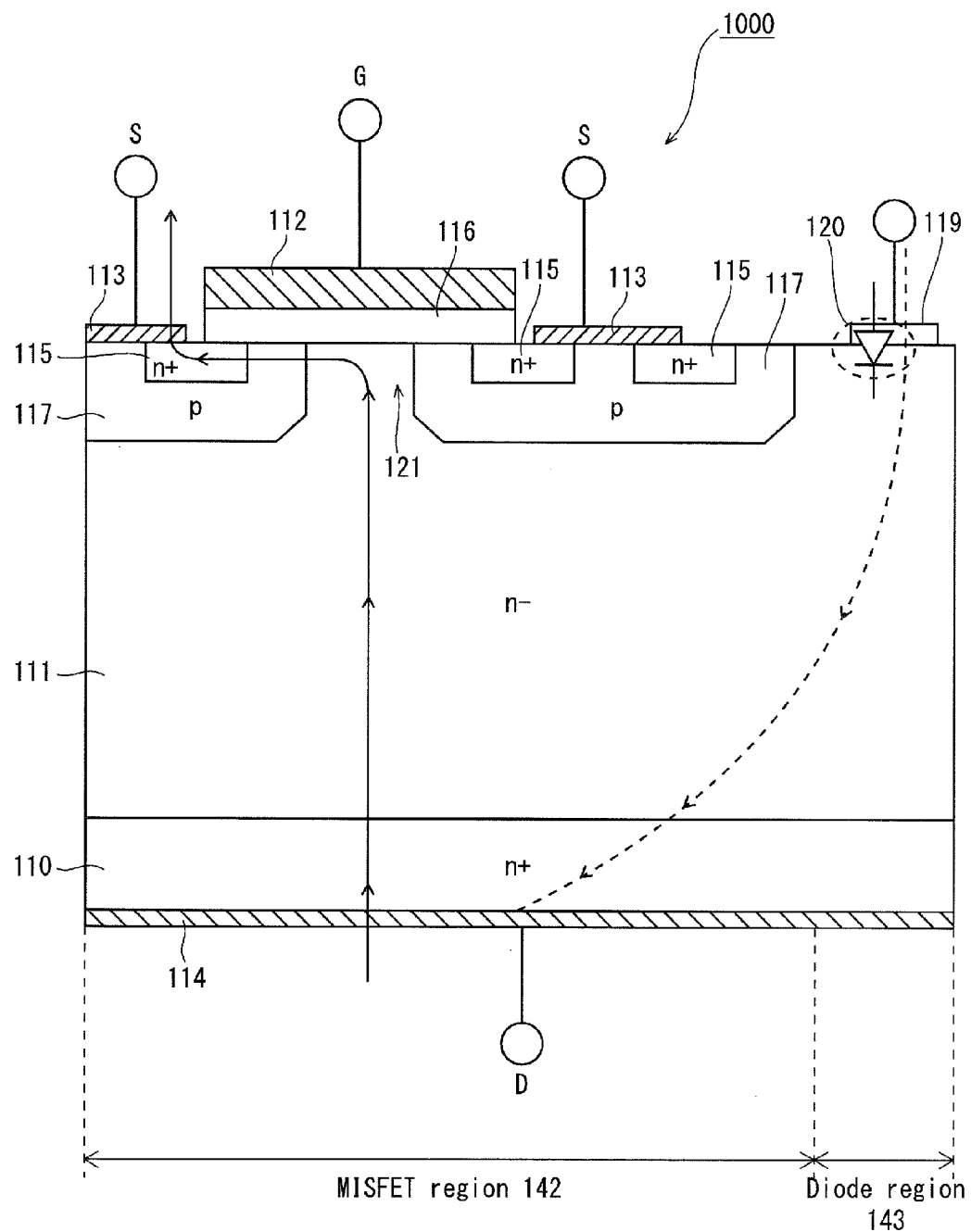
FIG. 3 is a schematic cross-sectional view showing the structure of switches H1 and L1 included in the inverter 101 pertaining to First Embodiment.

FIG. 3 is a schematic cross-sectional view showing the structure of the switches H1 and L1 included in the inverter 101 pertaining to the present embodiment.

As shown in FIG. 3, a semiconductor element 1000 has a structure in which an $n^-$ drift layer 111 is layered on a front surface of an $n^+$ substrate 110. A wide bandgap semiconductor substrate is used as the $n^+$ substrate 110. A representative example of the wide bandgap semiconductor substrate is SiC.

P-type body regions 117 are formed in the upper portions of the $n^-$ drift layer 111. $N^+$ source regions 115 are formed inside the p-type body regions 117.

Source electrodes 113 are formed on the p-type body regions 117 and the $n^+$ source regions 115. Gate electrodes 112 are formed on the $n^-$ drift layer 111, the p-type body regions 117 and the $n^+$ source regions 115 via a gate insulation film 116. The gate insulation film 116 is made of a silicon oxide film (e.g., $SiO_2$), a silicon oxynitride film, alumina (e.g., $Al_2O_3$), hafnium oxide (e.g., HfO), transition metal oxides (e.g., Ti, Zr, Nb and Ta), or the like. A Schottky electrode 119 made of metal (e.g., Ni, Ti and Mo) is disposed on a front surface of the $n^-$ drift layer 111. A drain electrode 114 is disposed on a back surface of the $n^+$ substrate 110. Note that the superscript signs "+" and "−" shown in the n-type regions in FIG. 3 indicate the concentration of n-type impurities. The concentration of n-type impurities increases in the order of $n^-$, n and $n^+$. In other words, in terms of the concentration of n-type impurities, the following relation is satisfied: $n^-<n<n^+$.

As described above, the semiconductor element 1000 has the structure of a metal-insulator-semiconductor field-effect transistor (MISFET) with the presence of the $n^+$ substrate 110, the $n^-$ drift layer 111, the p-type body regions 117, the $n^+$ source regions 115, the source electrodes 113, the gate insulation film 116, the gate electrodes 112, and the drain electrode 114. A region of the semiconductor element 1000 that has the MISFET structure is called a MISFET region 142.

The MISFET region 142, as the word suggests, functions as MISFET. The present description continues with the following definitions: the electric potential of the drain electrode 114, which is based on the electric potential of the source electrodes 113, is Vds; the threshold voltage of MISFET is Vth; and the electric potential of the gate electrodes 112, which is based on the electric potential of the source electrodes 113, is Vgs.

In the case of Vds≥0 (i.e., in the case of forward bias), when the relation Vgs≥Vth is satisfied (when MISFET is in the on-state), the interface between the p-type body regions 117 and the gate insulation film 116 becomes conductive. As a result, the current flows from the drain electrode 114 to the source electrodes 113 via a junction field-effect transistor (JFET) region 121. In the following description of the present embodiment, a region corresponding to the interface between the p-type body regions 117 and the gate insulation film 116, which becomes conductive when MISFET is in the on-state, is referred to as a "channel region". The JFET region 121 is a part of the $n^-$ drift layer 111 that is in the vicinity of the front surface of the $n^-$ drift layer 111 and that is located between two adjacent p-type body regions 117. A direction from the drain electrode 114 to the source electrodes 113 is illustrated as a solid line with arrows in FIG. 3. This direction is hereinafter referred to as a forward direction.

On the other hand, in the case of Vds<0 (in the case of reverse bias), when the relation Vgs≥Vth is satisfied (when MISFET is in the on-state), the channel region becomes conductive. As a result, the current flows from the source electrodes 113 to the drain electrode 114 via the JFET region 121. A direction from the source electrodes 113 to the drain electrode 114 is the reverse of the solid line with arrows illustrated in FIG. 3, and is hereinafter referred to as a reverse direction.

That is to way, when MISFET is in the on-state, the channel region becomes conductive in both forward and reverse directions.

When the relation Vgs<Vth is satisfied (when MISFET is in the off-state), the channel region is conductive in neither of the forward and reverse directions. That is to say, in the present embodiment, the channel region is conductive in neither of the forward and reverse directions when MISFET is in the off-state.

The semiconductor element 1000 also includes a diode region 143 in addition to the MISFET region 142. The diode region 143 is constituted by the $n^+$ substrate 110, the $n^-$ drift layer 111, the drain electrode 114, and the Schottky electrode 119. A Schottky barrier diode (SBD) 120 is formed in the diode region 143. The SBD 120 is constituted by the $n^-$ drift layer 111 and the Schottky electrode 119. The $n^-$ drift layer 111 is equivalent to a semiconductor region pertaining to the present invention.

The diode region 143 exhibits characteristics of a unipolar diode. In a case where a positive voltage is applied to the Schottky electrode 119 with respect to the drain electrode 114 (in a case of forward bias), the current flows from the Schottky electrode 119 to the drain electrode 114 along the path illustrated as a dotted line with arrows in FIG. 3. Conversely, in a case where a negative voltage is applied to the Schottky electrode 119 with respect to the drain electrode 114 (in a case of reverse bias), there is no conduction between the Schottky electrode 119 and the drain electrode 114.

It should be noted that in an inverter, the source electrodes 113 and the Schottky electrode 119 are connected to each other, and the MISFET region 142 and the diode region 143 are antiparallel to each other. Therefore, the forward bias for the MISFET region 142 corresponds to the reverse bias for the diode region 143, and the reverse bias for the MISFET region 142 corresponds to the forward bias for the diode region 143. As set forth above, with a direction from the drain electrode 114 to the source electrodes 113 defined as a forward direction, when the forward bias is applied to the diode region 143 (when the reverse bias is applied to the MISFET region 142), a current flows through the diode region 143 in the reverse direction. When the reverse bias is applied to the diode region 143 (when the forward bias is applied to the MISFET region 142), a current does not flow through the diode region 143.

In the diode region 143, the only semiconductor existing along the path illustrated as the dotted line with arrows in FIG. 3 is the n-type semiconductor. Accordingly, the diode region 143 is unipolar.

In the present embodiment, the SBD 120 formed in the diode region 143 is used as the freewheeling diodes DH1 and DL1 (FIG. 1). As described above, the SBD, which is used as a freewheeling diode, is built in the semiconductor element constituting each switch. It is therefore unnecessary to provide a freewheeling diode separately from the semiconductor element. Consequently, the size and manufacturing cost of each switch can be reduced. Furthermore, as the number of constituent elements of each switch is reduced, each switch brings about the advantageous effect of suppressing undesired oscillation and noise caused by the parasitic capacitance or parasitic inductance of the wiring.

The n$^+$ substrate 110 constituting the semiconductor element 1000 is a wide bandgap semiconductor substrate. Therefore, compared to a conventional switch constituted by a Si semiconductor, the switches pertaining to the present embodiment are advantageous in that the speed of switching operations is fast, switching losses can be reduced due to small on-resistance, and stable switching operations are possible even under high temperature. Moreover, as the semiconductor element 1000 has the MISFET structure, the switching speed of the semiconductor element 1000 is fast.

The following describes directions of currents flowing through the semiconductor element 1000 shown in FIG. 3, in association with directions of the flow of currents IH1, IL1 and ID1 shown in FIG. 1.

The current flowing through the channel region in the forward direction, which is illustrated by the solid line with arrows in FIG. 3, is equivalent to the current flowing through the path labeled "IH1" in FIG. 1. The path IH1 shows the flow when the high-side switch H1 serves as the main swtich. The current flowing through the channel region in the reverse direction (i.e., in the opposite direction from the forward direction illustrated by the solid line with arrows in FIG. 3) is equivalent to the current flowing through the path labeled "IL1" illustrated in FIG. 1. The path IL1 shows the flow when the low-side switch L1 serves as the rectifier swtich. The current flowing in the reverse direction along the dotted line with arrows in FIG. 3 is equivalent to the current flowing through the path labeled "ID1" in FIG. 1. The path ID1 shows the flow when the low-side switch L1 serves as the rectifier swtich.

<Switching Operation>

FIGS. 4A through 4I show a timing chart of the inverter 101 pertaining to the present embodiment during operation. In the timing chart, only the operations by the switches H1 and L1 included in the W-phase arm 104w shown in FIG. 1 are depicted. The following describes the operation of the inverter 101 pertaining to the present embodiment with reference to FIGS. 4A through 4I.

FIG. 4A shows a waveform of the current output by the W-phase arm 104w. FIG. 4B is an enlarged view of the portion within the circle depicted in FIG. 4A. In the portion within the circle, the high-side switch H1 serves as the main switch, and the low-side switch L1 serves as the rectifier switch. In the portion within the circle depicted in FIG. 4A, the swtiches perform the switching operation under non-zero current/voltage condition, and the current flowing through the switches has a finite current/voltage value.

Figure 4C:
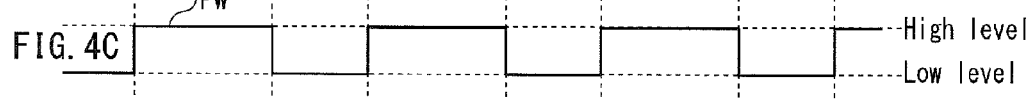

FIG. 4C shows a voltage waveform of the PWM signal Pw output from the controller 105.

Figure 4D:
Figure 4E:

FIG. 4D shows a voltage waveform of the gate drive signal SgH1 output from the gate drive circuit GD1. FIG. 4E shows a voltage waveform of the gate drive signal SgL1 output from the gate drive circuit GD1.

Figure 4F:
Figure 4H:
Figure 4I:

FIG. 4F shows a waveform of the current IH1 (FIG. 1) flowing through the channel region of the high-side switch H1. FIG. 4G shows a waveform of a current flowing through the entirety of the low-side switch L1. FIG. 4H shows a waveform of, from among currents flowing through the low-side switch L1, the current IL1 flowing through the channel region (along the path illustrated as the solid line with arrows in FIG. 3). FIG. 4I shows a waveform of the current ID1 flowing through the freewheeling diode DL1 (SBD 120) (along the path illustrated as the dotted line with arrows in FIG. 3). Put another way, the waveform shown in FIG. 4G is obtained by combining the waveforms shown in FIGS. 4H and 4I. In FIG. 4F, rising edges denote a forward current. In FIGS. 4G through 4I, falling edges denote a forward current.

The switching operation pertaining to the present embodiment is characterized in that the gate drive signals shown in FIGS. 4D and 4E are not provided with any dead time.

Because there is no need to provide dead times in the gate drive signals shown in FIGS. 4D and 4E as described above, the PWM signal Pw can be used as the gate drive signals SgH1 and SgL1 as-is without processing the PWM signal Pw (e.g., delaying the PWM signal Pw). With no dead time provided in the gate drive signals, the gate drive circuit GD1 need not have the structure for converting the PWM signal Pw output from the controller 105 into the gate drive signals SgH1 and SgL1 with dead times. Therefore, the structure of the gate drive circuit GD 1 can be simplified as shown in the circuit structure of FIG. 2. Conventionally, the W-phase arm 104w needs to have two gate drive circuits, one for controlling the high-side switch and the other for controlling the low-side switch. In contrast, with the structure of the present embodiment, the W-phase arm 104w has one gate drive circuit but can still perform control on the switches, thereby reducing the volume of components mounted in the inverter 101.

Furthermore, with no dead time provided in the gate drive signals shown in FIGS. 4D and 4E, there is no time period in which both of the switches H1 and L1 are in the off-state. In this case, no current flows through the freewheeling diode DL1 as shown in FIG. 4I.

Conventionally, dead times are provided in gate drive signals so as to prevent flow of a short circuit current, which occurs when the high-side switch H1 and the low-side switch L1 that are connected in series to each other are simultaneously placed in the on-state. However, through diligent studies, the inventors of the present application have found that a short circuit current does not flow between the high-side switch H1 and the low-side switch L1 if a time period in which both of the high-side switch H1 and the low-side switch L1 are in the on-state falls within a predetermined time period.

<Verification of the Finding That Short Circuit Current Does Not Flow Under Certain Condition>

First of all, the following discusses the state where the switches are connected to a power supply. For example, the power supply and each switch may be connected via a metallic plate called a busbar, via a metallic wire, or via a metallic line formed on a printed circuit board. The connection between the ground and each switch is similar to the connection between the power supply and each switch.

As a power line, the busbar has the inductance component, although the value of the inductance component is small. This undesired inductance component is referred to as parasitic inductance. In general, it is difficult to maintain the value of the parasitic inductance small (i.e., at 100 nH or lower). A description is now given of a case where the power supply and each switch are connected via a power line having a parasitic inductance of 100 nH. In this case, upon turning on both of the high-side switch and the low-side switch, a short circuit current does not flow even when using ideal switches that take 0 seconds to switch from the off-state to the on-state. This is because the equation $V=L \times dI/dt$ is valid, where L denotes the parasitic inductance, V denotes a power supply voltage applied to the parasitic inductance, and I denotes a current flowing through the parasitic inductance. This equation can be changed into the equation $dI/dt=V/L$. Provided the power supply voltage V is 100 V and the parasitic inductance L is 100 nH, the relation $dI/dt=100$ A/sec is satisfied. This change in the current, namely dI/dt, indicates that the short circuit current increases over time, and a short circuit current of 1 A flows through both switches after 1 ns has passed since both switches are turned on.

In a general inverter, a current of approximately 10 A or more flows through the switches. Therefore, even if a current of 10 A flows through the switches, the switches or the bulbar would not be damaged. In view of the above, it takes approximately 10 ns for a current of approximately 10 A to flow through the switches. This means that if the time period in which both switches are in the on-state is approximately 10 ns, a short circuit current does not flow through the switches, thereby enabling stable operation.

When the parasitic inductance L equals 10 nH, a current of 100 A flows through both switches after 10 ns has passed since both switches are turned on. Such a current is also permissible as a pulse current that occurs in a short amount of time.

However, when the parasitic inductance L equals 100 nH, if the time period in which both switches are in the on-state is 100 ns or longer, a current of 100 A or more flows through both switches. In this case, it is difficult to achieve safe operation.

The above verification shows that even when there is a time period in which both switches are in the on-state, if such a time period is approximately 10 ns to 100 ns, a short circuit current does not flow through both switches, thereby enabling safe operation.

<When Waveform of PWM Signal Does Not Match Waveforms of Gate Drive Signals>

As described above, in the present embodiment, the gate drive signals are not provided with any dead time due to the gate drive circuit outputting the signals for switching operations of the switches in synchronization. Here, by "the gate drive circuit outputting the signals for switching operations of the switches in synchronization", it means that in terms of waveforms of command signals output from the gate drive circuit to the switches, the timing at which the high-side switch H1 performs a switching operation matches the timing at which the low-side switch L1 performs a switching operation. However, as the wiring connecting between the gate drive circuit and each switch has a parasitic capacitance and parasitic inductance, a delay is caused by the parasitic capacitance and parasitic inductance. Therefore, the expression "the gate drive circuit outputting the signals for switching operations of the switches in synchronization" encompasses not only the case where the timing designated by the gate drive signal matches the timing of the switching operation of each switch, but also the case where the timing designated by the gate drive signal does not match the timing of the switching operation of each switch. This concept is described below in detail with reference to FIGS. 5A through 5E.

FIGS. 5A through 5E show a timing chart in which voltage waveforms of the gate drive signals SgH1 and SgL1 are depicted in correspondence with the states of the switches H1 and L1.

FIG. 5A shows voltage waveforms of the gate drive signals SgH1 and SgL1. On the other hand, FIGS. 5B to 5E show the states of the switches H1 and L1 (whether they are in the on-state or the off-state). In each of FIGS. 5B to 5E, the upper waveform shows the state of the high-side switch H1, whereas the lower waveform shows the state of the low-side switch L1.

FIG. 5B shows a case where the timings designated for the gate drive signals SgH1 and SgL1 match the actual timings of switching operations of the switches. This case shown in FIG. 5B corresponds to the timing chart of FIGS. 4A through 4I.

FIGS. 5C through 5E show cases where the timings designated for the gate drive signals SgH1 and SgL1 do not match the actual timings of switching operations of the switches. In the case of FIG. 5C, the high-side switch H1 and the low-side switch L1 operate in such a manner that there are time periods in which both of the high-side switch H1 and the low-side switch L1 are in the off-state. In the case of FIG. 5D, the switching operation of the low-side switch L1 is delayed overall compared to the switching operation of the high-side switch H1. In the case of FIG. 5E, there are time periods in which both of the high-side switch H1 and the low-side switch L1 are in the on-state.

In the cases of FIGS. 5D and 5E, a short circuit current does not flow as proved by the above verification, as long as each of the time periods A and B, in which both of the switches are in the on-state, falls in the range of 10 ns to 100 ns.

In the cases of FIGS. 5C and 5D, there are time periods C, D and E, in which both of the switches are in the off-state.

In a case where the structure of the switch disclosed in Patent Literature 1 is used, if there are time periods in which both of the switches H1 and L1 are in the off-state as the aforementioned time periods C, D and E, then a problem could arise where the short circuit current flows between the switches H1 and L1. This problem is discussed below with reference to FIG. 6 and FIGS. 7A through 7J.

Figure 6:
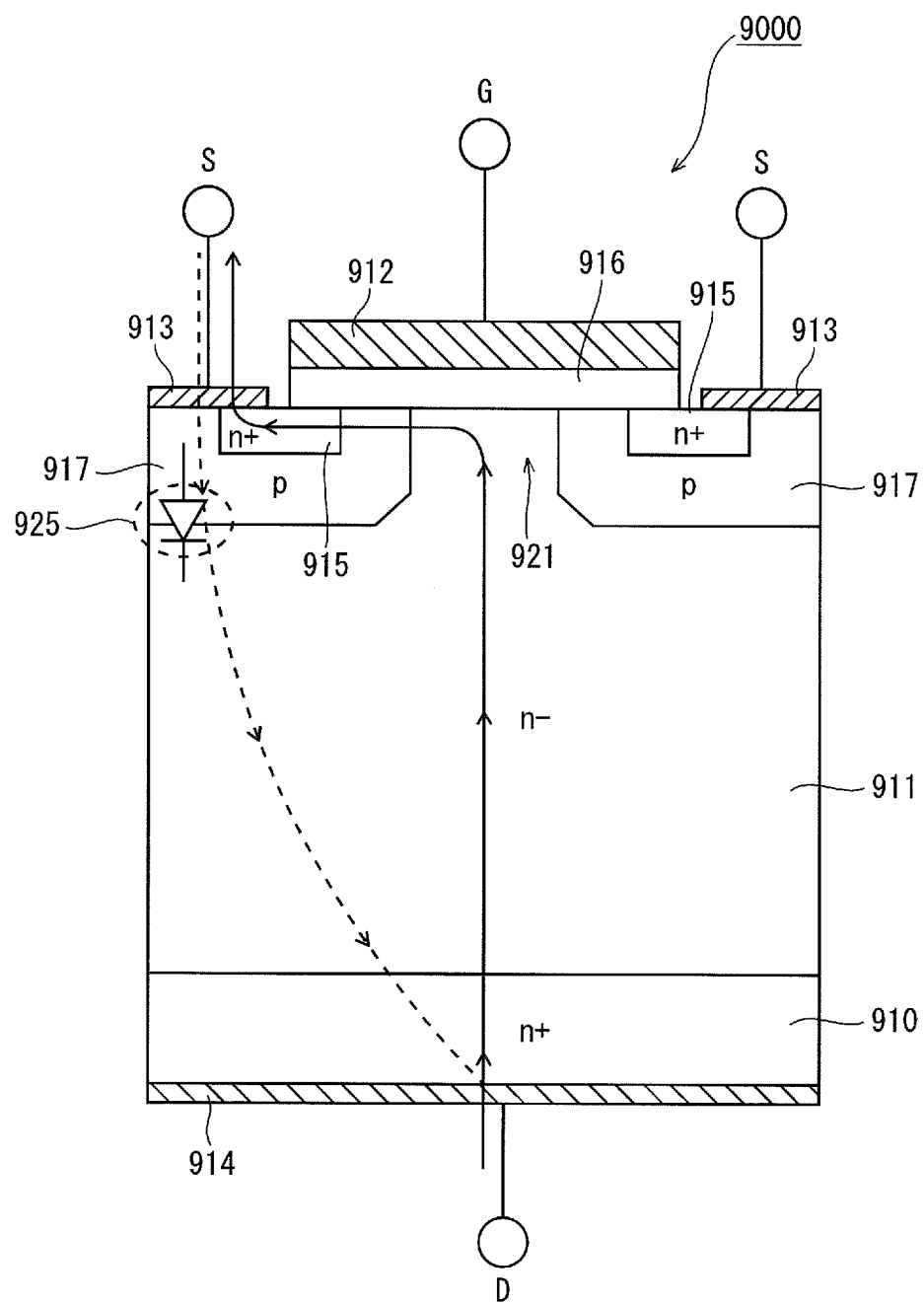
FIG. 6 is a schematic cross-sectional view showing the structure of a switch pertaining to a comparative example (Patent Literature 1).

FIG. 6 is a schematic cross-sectional view showing the structure of the switch pertaining to Patent Literature 1 as a comparative example. A semiconductor element 9000, which constitutes the switch, has a similar structure to the MISFET region of the semiconductor element 1000 illustrated in FIG. 3. The main structure of the semiconductor element 9000 is MISFET constituted by a wide bandgap semiconductor (e.g., SiC).

In the semiconductor element 9000, an n⁻ drift layer 911 is layered on a front surface of an n⁺ substrate (SiC substrate) 910, and p-type body regions 917 and n⁺ source regions 915 are disposed in the upper portions of the n⁻ drift layer 911 in the stated order. Source electrodes 913 are formed on the p-type body regions 917 and the n⁺ source regions 915. Gate electrodes 912 are formed on the n⁻ drift layer 911, the p-type body regions 917 and the n⁺ source regions 915 via a gate insulation film 916. A drain electrode 914 is disposed on a back surface of the n⁺ substrate 910. In a case where a current flows through the semiconductor element 9000 in the forward direction, the current flows through a JFET region 921 via a channel region along a path illustrated as a solid line with arrows in FIG. 6. Note, the channel region corresponds to the interface between the p-type body regions 917 and the gate insulation film 916. The current flowing along this path is equivalent to the current that flows through a switch serving as a main switch. On the other hand, when synchronous rectification is performed by applying the reverse bias to a switch, a current flows in the opposite direction from the direction of the path illustrated as the solid line with arrows in FIG. 6.

A parasitic body diode 925 is provided in the form of a p-n junction at the interface between the n⁻ drift layer 911 and the p-type body regions 917. The parasitic body diode 925 may also be referred to as a parasitic diode. The body diode 925 is a parasitic element that inherently exists in the structure of MISFET. When the semiconductor element 9000 functions as a diode, i.e., when a current flows in the reverse direction, the current flows through the body diode 925 along a path illustrated as a dotted line with arrows in FIG. 6.

In Patent Literature 1, this body diode 925 is used as a freewheeling diode. With this structure, the size of each switch can be reduced compared to a case where a separate diode is connected to the semiconductor element 9000 as a freewheeling diode.

However, when the body diode provided in the form of the p-n junction is used as a freewheeling diode, a problem could arise where a short circuit current flows due to flow of a recovery current. This problem is described below in detail with reference to the timing chart of FIGS. 7A through 7J.

FIGS. 7A through 7J show a timing chart obtained in a case where there are time periods in which both of a high-side switch and a low-side switch pertaining to the comparative example are in the off-state. The timing chart of FIGS. 7A through 7J corresponds to the case of FIG. 5C.

Figures 7A, 7B, 7C, 7D, 7E, 7F, 7G, 7H, 7I, 7J:
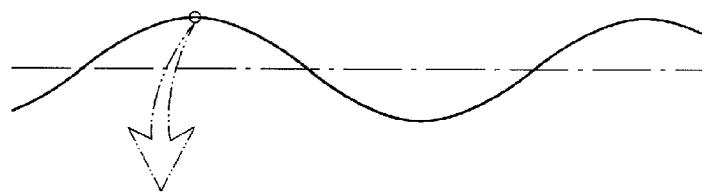
FIGS. 7A through 7J show a timing chart obtained in a case where there are time periods in which both of a high-side switch and a low-side switch pertaining to the comparative example are in the off-state.

FIG. 7A shows an output current waveform of one of the arms included in the three-phase bridge. FIG. 7B is an enlarged view of the portion within the circle.

FIG. 7C shows a voltage waveform of the gate drive signal output to the high-side switch. FIG. 7D shows a voltage waveform of the gate drive signal output to the low-side switch.

FIGS. 7E and 7F show the states of the high-side switch and the low-side switch (whether they are in the on-state or the off-state).

FIG. 7G shows a waveform of a current flowing through the channel region of the high-side switch. FIG. 7H shows a waveform of a current flowing through the entirety of the low-side switch. FIG. 7I shows a waveform of, from among currents flowing through the low-side switch, the current flowing through the channel region. FIG. 7J shows a waveform of the current flowing through the body diode 925 (along the path illustrated as the dotted line with arrows in FIG. 6). Put another way, the waveform shown in FIG. 7H is obtained by combining the waveforms shown in FIGS. 7I and 7J. In FIG. 7G, rising edges denote a forward current. In FIGS. 7H through 7J, falling edges denote a forward current.

In durations of dead times DT1 and DT2, a current flows through the freewheeling diode in the reverse direction only while both switches are in the off-state. The body diode 925, which is used as the freewheeling diode, is a p-n diode, namely a bipolar element. Therefore, a recovery current (A) flows due to a so-called minority carrier storage effect. More specifically, assume a case where a current flows through the freewheeling diode in the reverse direction during the dead time DT2 (a case where the forward bias is applied to the freewheeling diode). In this case, when the high-side switch is turned on at time (1), the freewheeling diode shifts from a forward-biased state to a reverse-biased state. At this time, because the freewheeling diode is a bipolar element, the freewheeling diode requires a time period to shift from the state where the reverse current flows through the freewheeling diode (the freewheeling diode is forward-biased) to the off-state. Note, in the off-state, a forward current does not flow through the freewheeling diode (the freewheeling diode is reverse-biased). This time period to shift to the off-state is equivalent to a time period required for minority carriers (electron holes) in the n region to disappear. During this time period, a recovery current (A), which is a reverse current, flows through the freewheeling diode.

Note, in the case of a p-n junction diode with a Si semiconductor, a time period during which the recovery current flows (recovery time period) is approximately a few hundred nanoseconds or longer.

In the time period during which the recovery current flows, both of the high-side switch and the low-side switch are in a conductive state (on-state) as shown in FIGS. 7G and 7H. That is to say, the time period during which the recovery current flows is a time period during which both switches are in the on-state. Therefore, when the time period during which the recovery current flows exceeds the above-mentioned time period of 10 ns to 100 ns, it means that the time period during which both switches are in the on-state exceeds the time period of 10 ns to 100 ns, with the result that a short circuit current flows between the switches.

Furthermore, using the structure of the switch pertaining to Patent Literature 1 brings about problems other than the above-described problem related to the short circuit current. First of all, it has been found that the recovery current is the cause of various problems such as switching losses, increase in noise, and damage to elements induced by overcurrent. The larger the amount of current flowing through the freewheeling diode in the reverse direction, the larger the amount of the recovery current. Hence, this problem is more prominent in a power semiconductor element through which a large amount of current flows (e.g., a switch used in an inverter). In addition, it has been reported that the deterioration of crystals in MISFET progresses when the body diode in MISFET is used as a freewheeling diode (Patent Literature 3 and Non-Patent Literature 1), with the result that stable operation of MISFET is not guaranteed. Furthermore, there is a problem unique to SiC where the crystallographic defects in SiC increase if a forward current continuously flows through the p-n junction. The increase in the crystallographic defects in SiC triggers an increase in switching losses (Non-Patent Literature 2). Moreover, because SiC is a wide bandgap semiconductor, the on-voltage required for the body diode at a room temperature is relatively high (i.e., approximately 2.7 V). This gives rise to the problem that the extent of switching losses increases.

In contrast, when the switches pertaining to the present embodiment are used, the above-described problem related to the short circuit current does not occur unlike Patent Literature 1, even if there are time periods in which both switches are in the off-state. This advantageous effect is described below with reference to FIGS. 8A through 8J.

FIGS. 8A through 8J shown a timing chart obtained in a case where there are time periods in which both of the switches H1 and L1 pertaining to the present embodiment are in the off-state. As with the timing chart of FIGS. 7A through 7J, the timing chart of FIGS. 8A through 8J corresponds to the case of FIG. 5C. Also, the waveforms shown in FIGS. 8A through 8J correspond to the waveforms shown in FIGS. 7A through 7J.

In the present embodiment, SBD is used as a freewheeling diode as shown in FIG. 3. SBD is a unipolar diode. Therefore, unlike a bipolar diode such as the body diode provided in MISFET, minority carriers do not flow into SBD. As a result, as indicated by time (1) in FIG. 8J, there is hardly any time period in which the recovery current flows due to the minority carrier storage effect. In this way, the time period during which the recovery current flows does not exceed the above-mentioned time period of 10 ns to 100 ns, thus preventing the flow of the short circuit current.

Furthermore, as the recovery current hardly flows, switching losses caused by the flow of the recovery current decrease. This allows increasing the switching frequency. Consequently, the value of the capacitance of the capacitor (passive component) and the value of the inductance of the reactor (passive component) can be reduced. This contributes to a reduction in the size and cost of the capacitor and the reactor. In addition, due to a reduction in noise, the number of components for reducing noise (e.g., noise filter) can be reduced, which enables further cost reduction.

Moreover, in the present embodiment, a current does not flow through the body diode provided in MISFET. Therefore, problems such as progression in deterioration of crystals in MISFET, increase in switching losses owing to a high on-voltage for the diode.

Second Embodiment

The following describes Second Embodiment with a focus on differences from First Embodiment. Note that the timing chart pertaining to the present embodiment is similar to the timing chart of FIGS. 4A through 4I, and is therefore omitted from the following description.

<Overall Structure>

Figure 9:
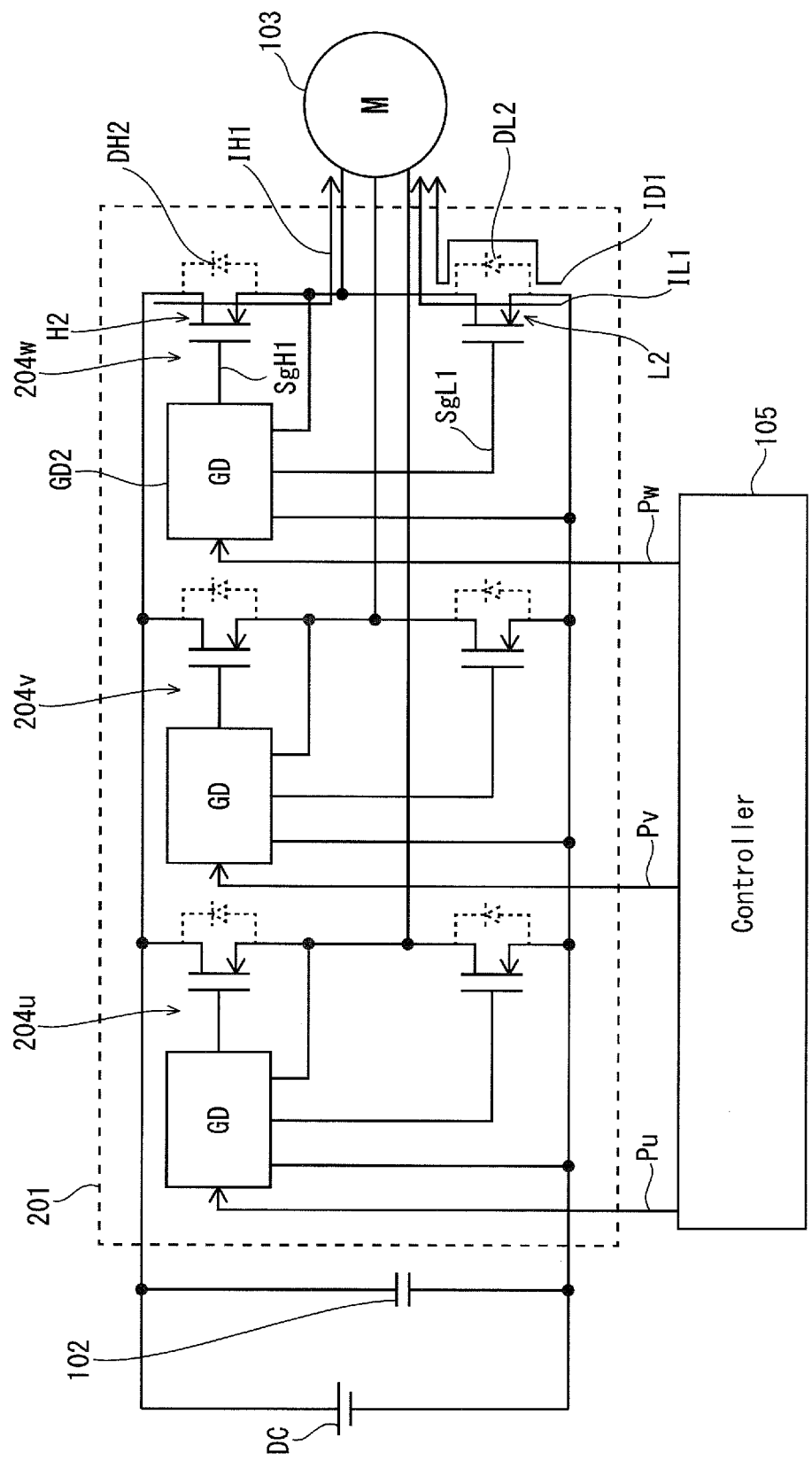
FIG. 9 shows an overall structure of a load driving system 200 including an inverter 201 pertaining to Second Embodiment.

FIG. 9 shows an overall structure of a load driving system 200 including an inverter pertaining to Second Embodiment. The load driving system 200 differs from the load driving system 100 pertaining to First Embodiment in the structure of an inverter 201, especially in the structure of switches H2 and L2. Note that constituent elements of the load driving system 200 that are the same as those of the load driving system 100 have the same reference signs thereas, and are omitted from the following description.

As with the inverter 101 pertaining to First Embodiment, the inverter 201 includes a U-phase arm 204u, a V-phase arm 204v and a W-phase arm 204w. The W-phase arm 204w includes a high-side switch H2 and a low-side switch L2, which are connected in series. Based on a PWM signal Pw output from a controller 105, a gate drive circuit GD2 generates gate drive signals SgH1 and SgL1 to be output to the switches H2 and L2. Freewheeling diodes DH2 and DL2 are respectively connected to the switches H2 and L2. The structure of the switches H2 and L2 pertaining to the present embodiment is different from the structure of the switches H1 and L1 pertaining to First Embodiment. The following discusses the difference with reference to FIGS. 10 and 11.

<Structure of Switches>

Figure 10:
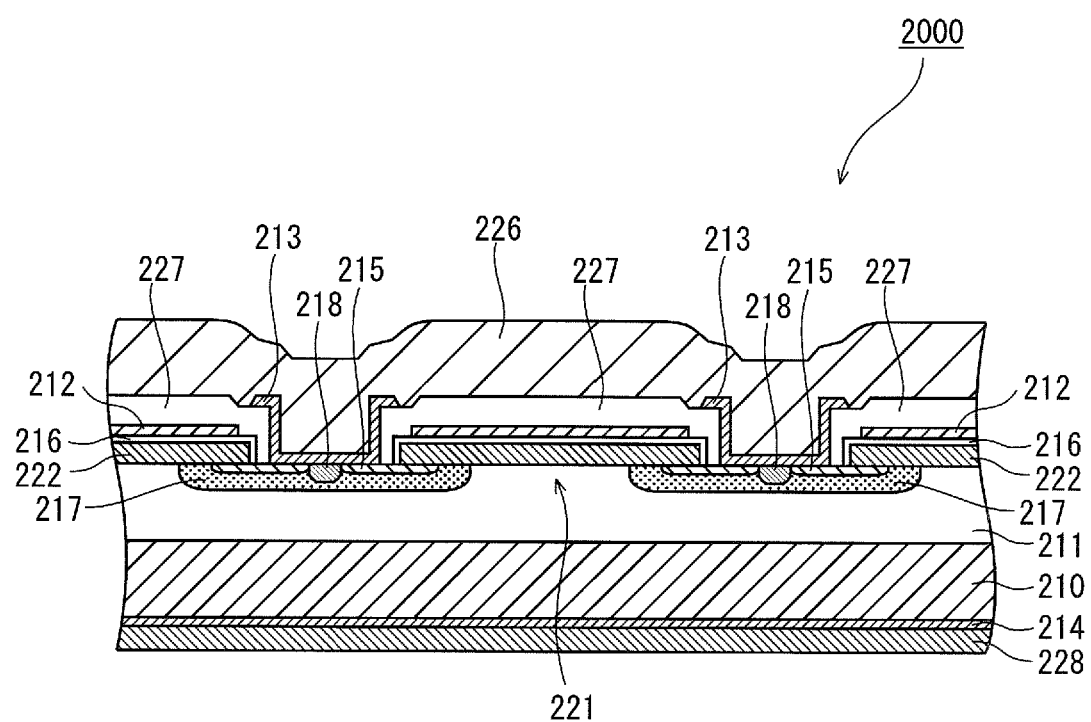
FIG. 10 is a schematic cross-sectional view showing the structure of switches H2 and L2 included in the inverter 201 pertaining to Second Embodiment.
Figure 11:
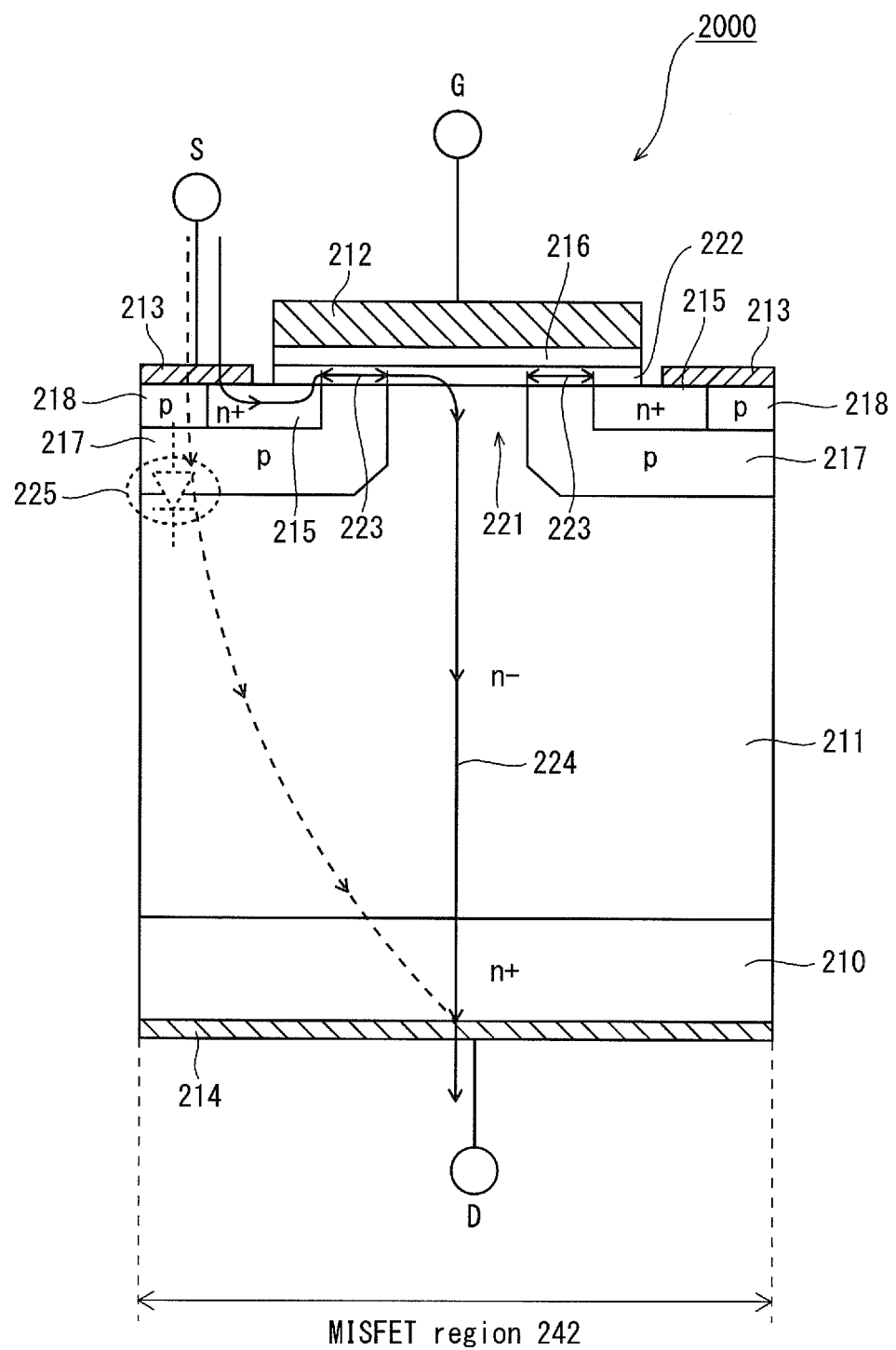
FIG. 11 is a schematic cross-sectional view for illustrating the operations of the switches H2 and L2 included in the inverter 201 pertaining to Second Embodiment.

FIG. 10 is a schematic cross-sectional view showing the structure of the switches H2 and L2 included in the inverter 201 pertaining to the present embodiment. FIG. 11 is a schematic cross-sectional view for illustrating the operations of the switches H2 and L2. This cross-sectional view is obtained by extracting parts of the structure shown in FIG. 10 that are necessary to explain the operations of the switches H2 and L2. As with First Embodiment, a semiconductor element 2000, which constitutes each of the switches H2 and L2, is constituted by a wide bandgap semiconductor having the structure of a metal-insulator-semiconductor field-effect transistor (MISFET).

As shown in FIGS. 10 and 11, the semiconductor element 2000 has a structure in which an $n^-$ drift layer 211 is layered on a front surface of an $n^+$ substrate 210. A wide bandgap semiconductor substrate is used as the $n^+$ substrate 210. A representative example of the wide bandgap semiconductor substrate is SiC.

P-type body regions 217 are formed in the $n^-$ drift layer 211. $N^+$ source regions 215 are formed in the p-type body regions 217. P-type contact regions 218 are also formed in the p-type body regions 217. Source electrodes 213 are formed on the $n^+$ source regions 215 and the p-type contact regions 218. The source electrodes 213 are electrically connected to both of the $n^+$ source regions 215 and the p-type contact regions 218. A part of the $n^-$ drift layer 211 that is in the vicinity of a front surface of the $n^-$ drift layer 211 and that is positioned between two adjacent p-type body regions 217 is referred to as a JFET region 221.

Channel layers 222, which are n-type SiC semiconductor regions formed by epitaxial growth, are arranged on the $n^-$ drift layer 211. The channel layers 222 are arranged so as to be in contact with at least a part of the p-type body regions 217 and a part of the $n^+$ source regions 215. Gate electrodes 212 are formed on the channel layers 222 via a gate insulation film 216. An interlayer insulation film 227 is formed between any two adjacent gate electrodes 212. Source wiring 226 is layered above the interlayer insulation films 227.

A drain electrode 214 is disposed on a back surface of the $n^+$ substrate 210. A back surface electrode 228 (FIG. 10) is formed on a back surface of the drain electrode 214 for die bonding.

As shown in FIG. 11, the semiconductor element 2000 has the structure of a metal-insulator-semiconductor field-effect transistor (MISFET). Specifically, the MISFET structure is constituted by the $n^+$ substrate 210, the $n^-$ drift layer 211, the p-type body regions 217, the $n^+$ source regions 215, the p-type contact regions 218, the source electrodes 213, the channel layers 222, the gate insulation film 216, the gate electrodes 212, and the drain electrode 214. A region of the semiconductor element 2000 that has the MISFET structure is referred to as a MISFET region 242.

In FIG. 11, the channel layers 222 include regions 223 located on the p-type body regions 217. When MISFET is in the on-state, these regions 223 function as channels via which conduction is established between the source electrodes 213 and the drain electrode 214. In the following description, these regions 223 are referred to as channel regions 223. The length of each channel region 223 is defined as a horizontal dimension of the interface between the p-type body region 217 and the channel layer 222, as indicated in FIG. 11.

In First Embodiment, the diode region 143, which is provided separately from the MISFET region 142, functions as a freewheeling diode. On the other hand, in the present embodiment, a separate diode region is not provided in the semiconductor element 2000. Instead, the MISFET region 242 has functions of a diode region. The following section describes the MISFET region 242 in detail.

<Operations of Semiconductor Element 2000>

The following describes the operations of the semiconductor element 2000 with reference to FIG. 11. The present description is given with the following definitions: the electric potential of the drain electrode 214, which is based on the electric potential of the source electrodes 213, is Vds; the threshold voltage of MISFET is Vth; and the electric potential of the gate electrodes 212, which is based on the electric potential of the source electrodes 213, is Vgs.

In the case of Vds≥0 (i.e., in the case of forward bias), when the relation Vgs≥Vth is satisfied (when MISFET is in the on-state), the channel regions 223 become conductive, and accordingly, a current flows via the JFET region 221 in the forward direction. The JFET region 221 is a part of the n⁻ drift layer 211 that is in the vicinity of the front surface of the n⁻ drift layer 211 and that is located between two adjacent p-type body regions 217. Here, the forward direction is the reverse of the direction of a path 224 illustrated as a solid line with arrows in FIG. 11.

On the other hand, in the case of Vds<0 (in the case of reverse bias), when the relation Vgs≥Vth is satisfied (when MISFET is in the on-state), the channel regions 223 become conductive. As a result, a current flows via the JFET region 221 in the reverse direction. Here, the reverse direction is the direction of the path 224 illustrated as the solid line with arrows in FIG. 11.

That is to way, when MISFET is in the on-state, the channel regions 223 become conductive in both forward and reverse directions. The above operation is the same as the operation of the MISFET region 142 in the semiconductor element 1000 pertaining to First Embodiment. However, when the relation Vgs<Vth is satisfied (when MISFET is in the off-state), the operation of the MISFET region 242 in the semiconductor element 2000 differs from the MISFET region 142 in the semiconductor element 1000.

Figure 12A:
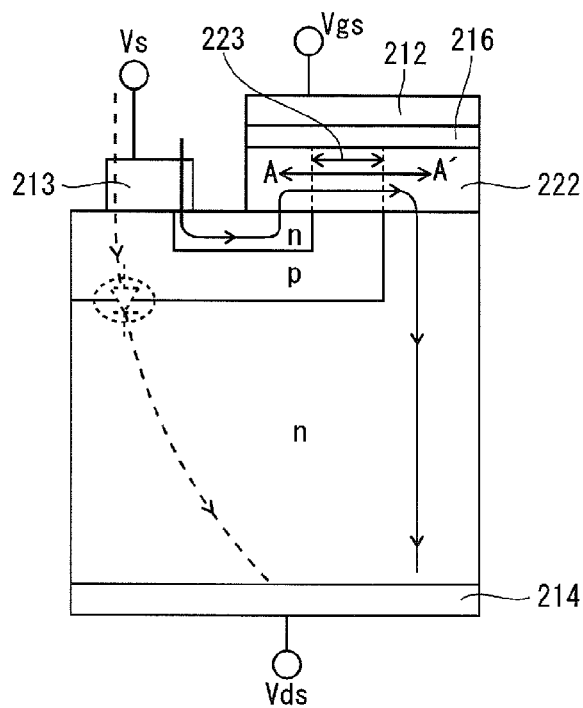
FIGS. 12A through 12C illustrate characteristics of forward and reverse directions of a semiconductor element 2000 pertaining to Second Embodiment.
Figure 12B:
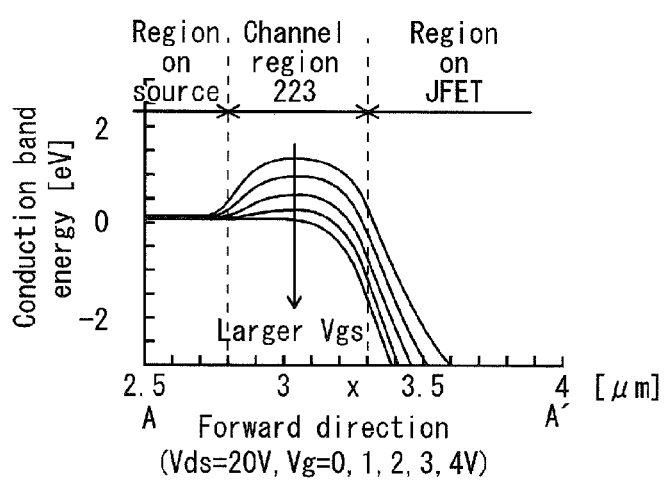
Figure 12C:
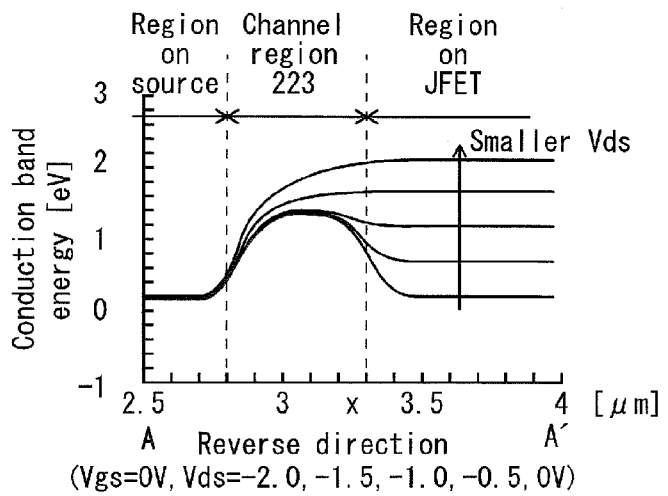

The following describes characteristics of the forward and reverse directions of the semiconductor element 2000 pertaining to the present embodiment, with reference to FIGS. 12A through 12C. FIG. 12A is a cross-sectional view showing a part of the semiconductor element 2000 in the vicinity of a channel region 223. FIGS. 12B and 12C are graphs showing a distribution of the conduction band energy at a cross-section taken along A-A' in FIG. 12A when a current flows. Note, the current flows in the forward direction in the case of FIG. 12B, and in the reverse direction in the case of FIG. 12C.

The following describes characteristics of the forward direction in the semiconductor element 2000 (in the case of Vds≥0) with reference to FIG. 12B. When the equations Vds=20 V and Vgs=0 V are both valid, i.e., in the case of the top curve of the graph shown in FIG. 12B, carriers do not flow because the conduction band energy of the channel region 223 is higher than the conduction band energy of a region on the source and the conduction band energy of a region on JFET. In the case of Vds=20 V, if a gate voltage is applied so as to increase Vgs from 0 V, the conduction band energy of the channel region 223 decreases, thus removing the barrier between the region on the source and the channel region 223. As a result, carriers (electrons) flow from the n⁺ source region 215 toward the JFET region 221 (toward the drain electrode 214) via the channel region 223.

The following describes characteristics of the reverse direction in the semiconductor element 2000 (in the case of Vds<0) with reference to FIG. 12C. When the equations Vgs=0 V and Vds=0 V are both valid, i.e., in the case of the bottom curve of the graph shown in FIG. 12C, carriers do not flow because the conduction band energy of the channel region 223 is higher than the conduction band energy of a region on the source and the conduction band energy of a region on JFET. In the case of Vgs=0 V, if Vds is gradually reduced from 0 V, the conduction band energy of the region on JFET increases, thus decreasing the barrier between the region on JFET and the channel region 223. As a result, carriers (electrons) flow from the JFET region 221 (from the drain electrode 214) toward the n⁺ source region 215 via the channel region 223. As a result, a reverse current starts to flow through the channel region 223 in the channel layer 222, i.e., the channel diode, before flowing through the body diode 225. Here, an absolute value of Vds when a current starts to flow through the channel diode is defined as Vf0.

Figure 13A:
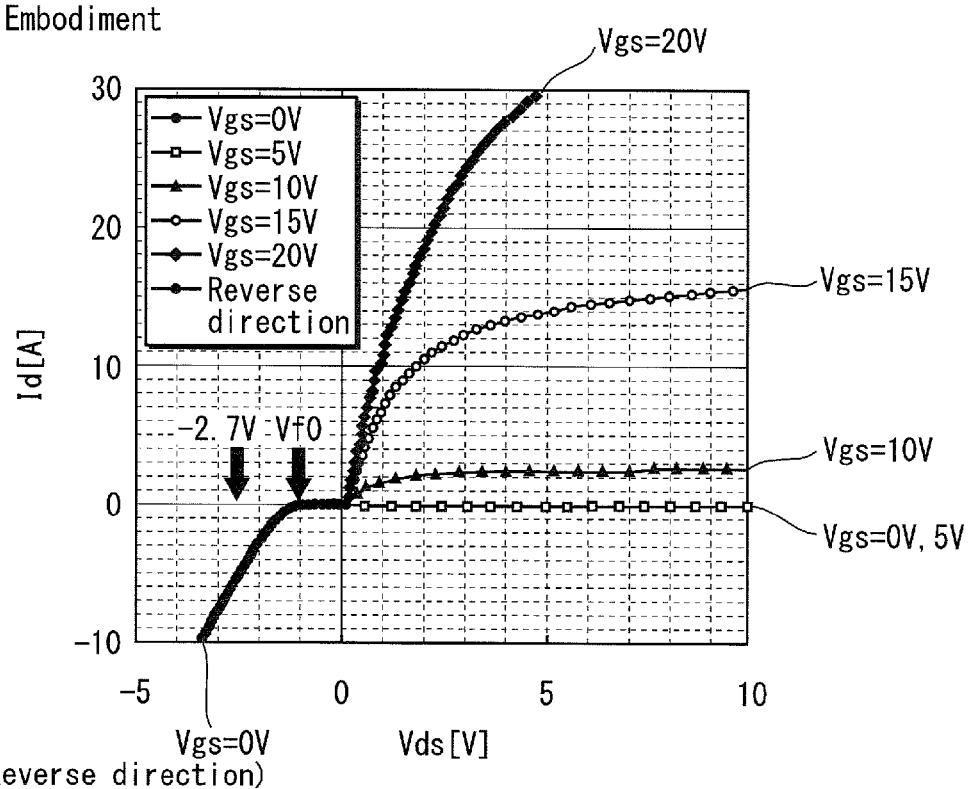
FIG. 13A shows I-V characteristics of the semiconductor element 2000 pertaining to Second Embodiment at room temperature.

In the MISFET region 142 pertaining to First Embodiment, when the relation Vgs<Vth is satisfied (when MISFET is in the off-state), the channel region is conductive in neither of the forward and reverse directions. In contrast, in the MISFET region 242 pertaining to the present embodiment, even when the relation 0≤Vgs<Vth is satisfied (when MISFET is in the off-state), the channel region 223 becomes conductive as long as the relation Vds<−Vf0 (the state of reverse bias) is satisfied. This way, a current flows via the JFET region 221 in the reverse direction, namely, in the direction of the path 224 illustrated as the solid line with arrows in FIG. 11. Therefore, when the relations 0≤Vgs<Vth and Vds<−Vf0 are both satisfied, the MISFET region 242 can function as a diode region. In the present embodiment, the function of the MISFET region 242 as a diode region is used as a freewheeling diode. In the following description, characteristics represented by flow of a current in the reverse direction when the relations 0≤Vgs<Vth and Vds<−Vf0 are both satisfied are referred to as a channel diode. Note that the on-voltage (Vf0) for the channel diode is set to be smaller than 2.7 V, which is the on-voltage for the body diode 225 in the MISFET region 242 (FIG. 13A).

A path through which a reverse current flows via the channel region 223 when MISFET is in the on-state is the same as a path through which a reverse current flows through the channel region 223 when the channel diode is in the on-state. This path is the path 224 illustrated as the solid line with arrows in FIG. 11. For reference, a path through which a reverse current flows through the body diode 225 of the MISFET region 242 is illustrated as a dotted line with arrows in FIG. 11. This path is clearly different from the path 224 illustrated as the solid line with arrows in FIG. 11.

Just like general MISFET, when the relations 0≤Vgs<Vth and Vds≥0 are both satisfied, a current is conducted in neither of the forward and reverse directions between the source electrodes 213 and the drain electrode 214, and MISFET is in the off-state.

<Current-Voltage Characteristics of Semiconductor Element 2000>

Figure 13B:
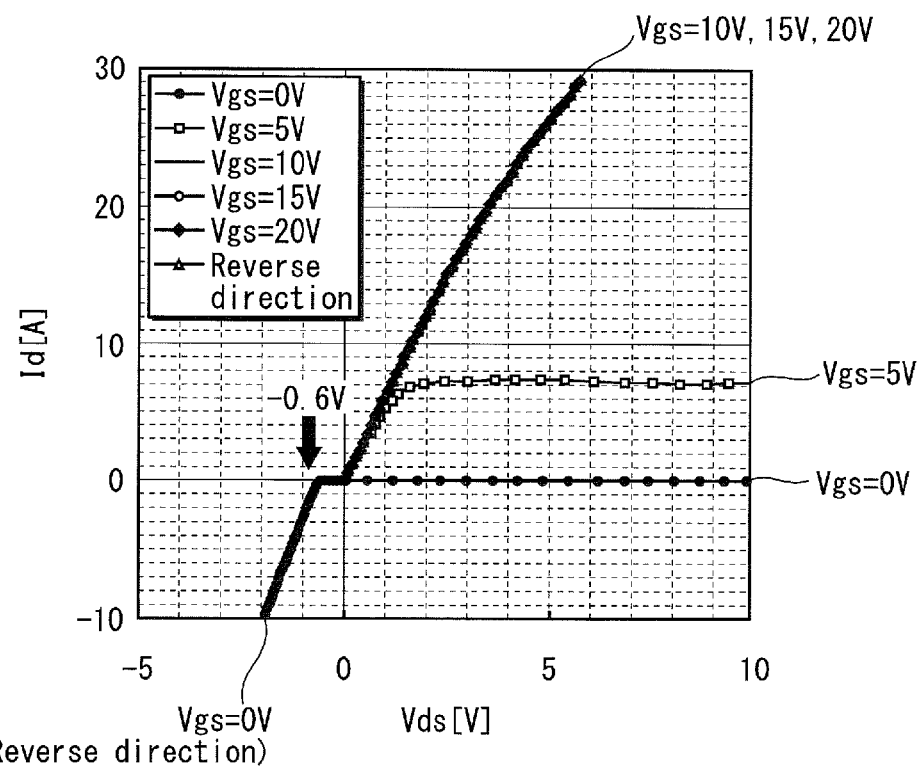
FIG. 13B shows I-V characteristics of a comparative example, namely MOSFET using a Si semiconductor, at room temperature.

The following describes current-voltage characteristics (I-V characteristics) of the semiconductor element 2000 with reference to FIGS. 13A and 13B. FIG. 13A shows the I-V characteristics of the semiconductor element 2000, which was experimentally created by the inventors of the present application, at a room temperature. The experimentally created semiconductor element 2000 is a double implanted MOSFET (DMOSFET) using SiC and has the same structure as the structure shown in FIG. 10. DMOSFET is one type of MISFET.

In each of the graphs shown in FIGS. 13A and 13B, the horizontal axis indicates Vds, and the vertical axis indicates the value of a current flowing in the forward direction. It is assumed that when a current flows in the reverse direction, the value indicated by the vertical axis is a negative value.

The I-V characteristics of the forward direction (Vds≥0V) were measured when Vgs=0, 5, 10, 15 and 20 V. The I-V characteristic of the reverse direction (Vds<0V) was measured when Vgs=0 V.

As apparent from FIG. 13A, in the semiconductor element 2000, an absolute value of the on-voltage Vf0 of the reverse current is approximately 1 V, which is smaller than the diffusion potential for the p-n junction of SiC, namely 2.7 V. Note, the diffusion potential for the p-n junction of SiC is equivalent to the on-voltage for the body diode. As the absolute value of Vf0 is smaller than the on-voltage for the body diode, a reverse current flows through the channel region (channel diode) in MISFET, but not through the body diode.

Hence, use of the channel diode reduces conduction losses. The on-voltage for the body diode depends on the bandgap width of the semiconductor material. Therefore, the on-voltage for the body diode is high especially in a wide bandgap semiconductor such as a silicon carbide semiconductor. As a result, a reduction in conduction losses caused by flow of the reverse current via the channel diode has a more significant meaning.

FIG. 13B shows the I-V characteristics of a comparative example, which is MOSFET using Si, at a room temperature. In the comparative example, an absolute value of the on-voltage of a reverse current is 0.6 V. Here, the reverse current flows through the body diode. Thus, the on-voltage of the reverse current is equivalent to the on-voltage for the body diode. The dielectric breakdown field of Si is smaller than that of SiC. Thus, in order for the comparative example to obtain the same dielectric strength voltage as SiC, it is necessary to reduce the concentration of impurities in the n⁻ drift layer by increasing the thickness of the n⁻ drift layer. However, configuring the n⁻ drift layer in such a manner gives rise to the problem that although Si-MISFET and SiC-MISFET have the same dielectric strength voltage, Si-MISFET suffers increased conduction losses compared to SiC-MISFET. Furthermore, as the bandgap of Si is low (i.e., 1.1 eV), a leak current increases at the p-n junction at a temperature of approximately 150° C. Therefore, when the Si-MISFET is used, there is a restriction on the operating temperature.

As described above, in the semiconductor element 2000 pertaining to the present embodiment, a reverse current flows through the channel region when the switches function as a diode. That is to say, the path of the current flowing through the channel diode is completely different from the path of the current flowing through a parasitic body diode. With this structure, the on-voltage for the channel diode can be made smaller than the on-voltage for the body diode, thereby reducing conduction losses.

Furthermore, unlike the semiconductor element 1000 pertaining to First Embodiment, the MISFET region has functions of a diode region in the semiconductor element 2000. Therefore, there is no need to provide a diode region separately from the MISFET region. This makes it possible to further reduce the size of each switch. In addition, in the present embodiment, a reverse current flows through the channel region when the MISFET region functions as a freewheeling diode. Therefore, the length of the path through which this reverse current flows is shorter in the present embodiment than in First Embodiment. Hence, compared to First Embodiment, the present embodiment accelerates the speed of turning on the freewheeling diode and reduces the extent of delay in the actual operations of the switches with respect to the gate drive signals.

As with SBD pertaining to First Embodiment, the above-described channel diode performs unipolar operations. Accordingly, a voltage drop in the forward direction is smaller in the above-described channel diode than in a bipolar diode. Therefore, compared to a case where a bipolar diode is used, the present embodiment can improve the power conversion efficiency and provide the advantageous effect of suppressing heat generation by the freewheeling diode.

Moreover, in the semiconductor element 2000, a reverse current flows via the channel layers 222. As such, the problem of an increase in the crystallographic defects, which are caused by passing a current through the p-n junction, can be avoided.

<Method for Manufacturing Semiconductor Element 2000>

The following describes a method for manufacturing the semiconductor element 2000 with reference to FIG. 10 and FIGS. 14A through 17C.

Figure 14A:
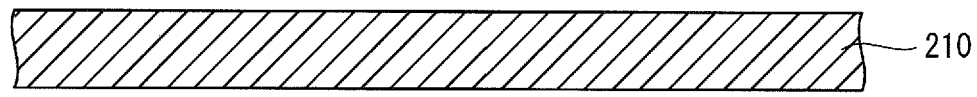
FIGS. 14A through 14C show one example of a method for manufacturing the semiconductor element 2000 pertaining to Second Embodiment.
Figure 14B:
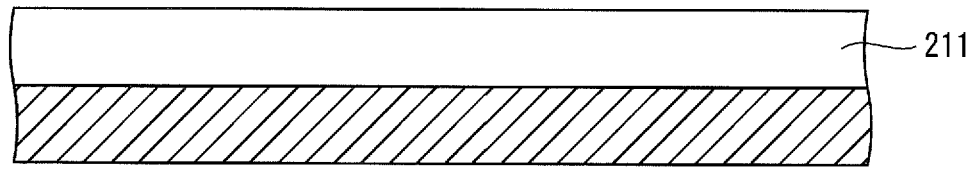

As shown in FIG. 14A, the n⁺ substrate (SiC substrate) 210 is prepared. For example, an n-type off-cut 4H—SiC substrate having low resistance may be used as the n⁺ substrate 210. Next, as shown in FIG. 14B, the n⁻ drift layer 211 having high resistance is formed on the n⁺ substrate 210 by epitaxial growth. For example, n-type 4H—SiC may be used as the n⁻ drift layer 211. Then, as shown in FIG. 14C, a mask 230 made of SiO₂ or the like is formed on the n⁻ drift layer 211, and ions 231 (e.g., aluminum (Al) ions or boron (B) ions) are injected.

Figure 14C:
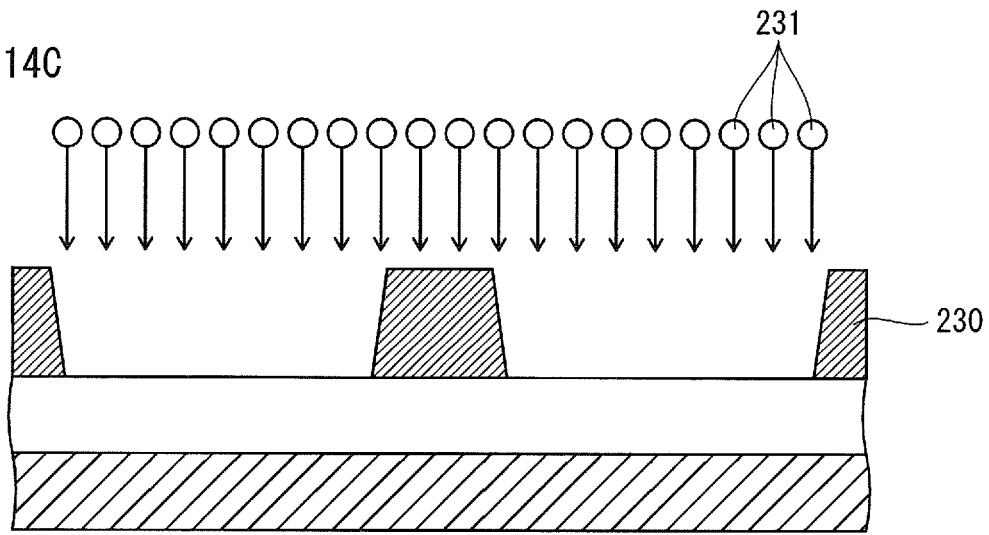
Figure 15A:
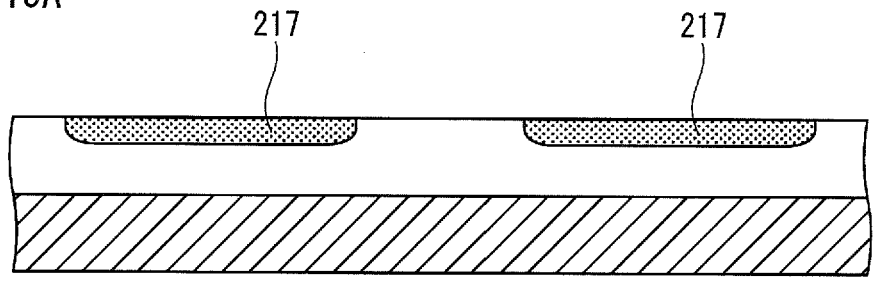
FIGS. 15A through 15C show one example of a method for manufacturing the semiconductor element 2000 pertaining to Second Embodiment.
Figure 15B:
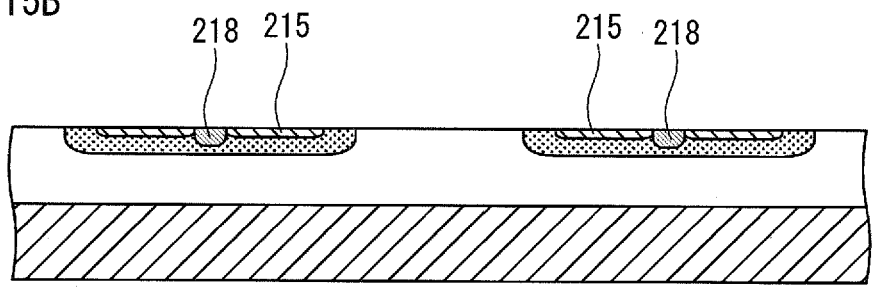

After the ions 231 are injected as shown in FIG. 14C, the mask 230 is removed, and activation annealing is performed in an inert atmosphere at a high temperature (e.g., approximately 1700° C.). As a result, the p-type body regions 217 are formed as shown in FIG. 15A. Next, a mask (not illustrated) is formed, and nitrogen ions or the like are injected into the p-type body regions 217. As a result, the n⁺ source regions 215 are formed as shown in FIG. 15B. Thereafter, the p-type contact regions 218 are formed by injecting Al ions or B ions. Then, the mask is removed and activation annealing is performed. At this time, the activation annealing is performed for approximately 30 minutes in an inert atmosphere at a temperature of approximately 1700° C. to 1800° C.

It has been described above that the activation annealing is performed in the step of FIG. 15A. Alternatively, the activation annealing may not be performed in the step of FIG. 15A. In this case, the activation annealing may be collectively performed in the step of FIG. 15B to compensate for not performing the activation annealing in the step of FIG. 15A.

Figure 15C:
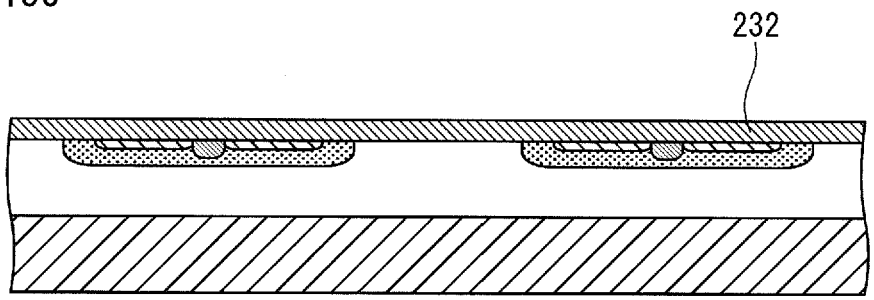

Next, as shown in FIG. 15C, an epitaxial layer 232 is epitaxially grown over the entire front surface of the n⁻ drift layer 211 which includes the p-type body regions 217, the n⁺ source regions 215 and the p-type contact regions 218 by using silicon carbide. Note that the epitaxial layer 232 may be structured such that the concentration of impurities therein changes along a direction of the thickness thereof.

Figure 16A:
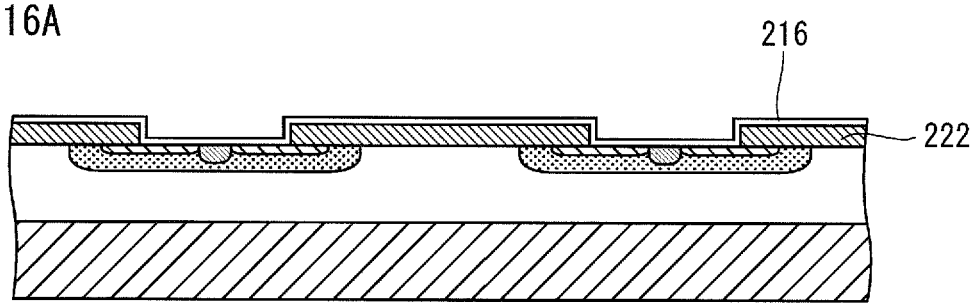
FIGS. 16A through 16C show one example of a method for manufacturing the semiconductor element 2000 pertaining to Second Embodiment.
Figure 16B:
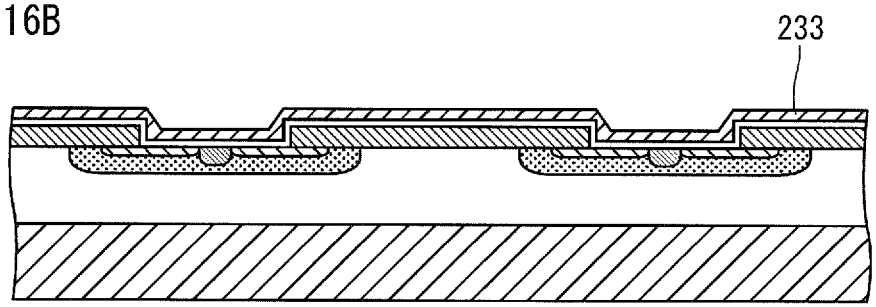
Figure 16C:
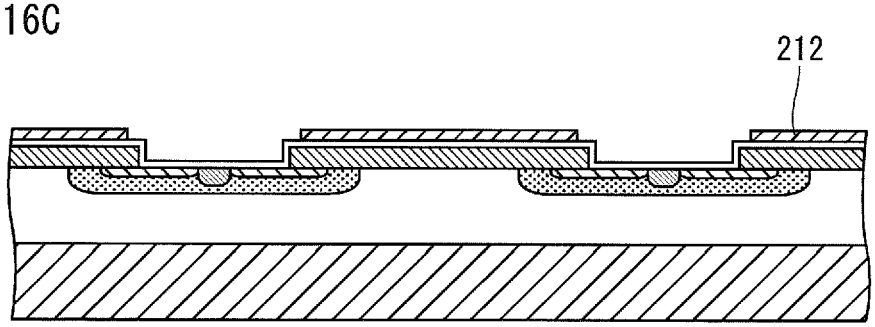

Subsequently, as shown in FIG. 16A, channel layers 222 are formed by dry-etching predetermined portions of the epitaxial layer 232. Then, the gate insulation film 216 is formed by thermally oxidizing front surfaces of the channel layers 222. Thereafter, as shown in FIG. 16B, a polycrystalline silicon film 233 doped with phosphorus (P) ions is deposited on a front surface of the gate insulation film 216. For example, the polycrystalline silicon film 233 has a thickness of approximately 500 nm. Next, as shown in FIG. 16C, gate electrodes 212 are formed at desired locations by dry-etching the polycrystalline silicon film 233 with use of a mask (not illustrated).

Figure 17A:
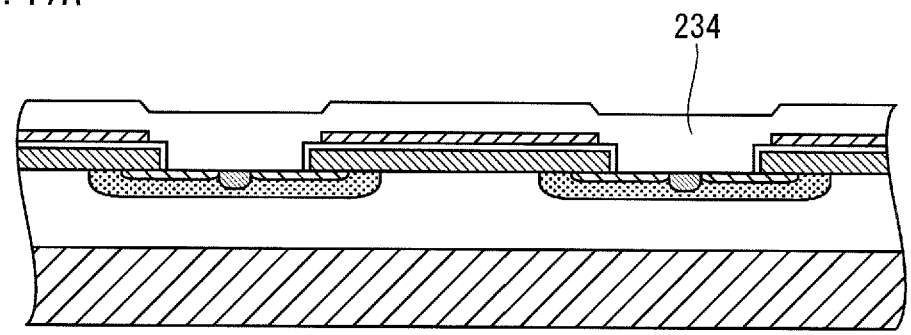
FIGS. 17A through 17C show one example of a method for manufacturing the semiconductor element 2000 pertaining to Second Embodiment.
Figure 17B:
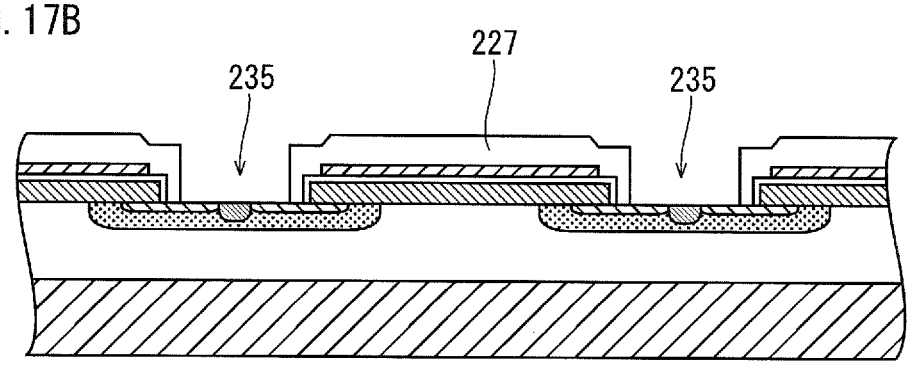

Subsequently, as shown in FIG. 17A, a $SiO_2$ layer 234 is deposited by, for example, a CVD process so as to cover the front surfaces of the gate electrodes 212 and the $n^-$ drift layer 211. For example, the $SiO_2$ layer 234 has a thickness of 1.5 μm. Next, as shown in FIG. 17B, the interlayer insulation films 227 and vias 235 are formed by performing dry etching with use of a mask (not illustrated).

Figure 17C:
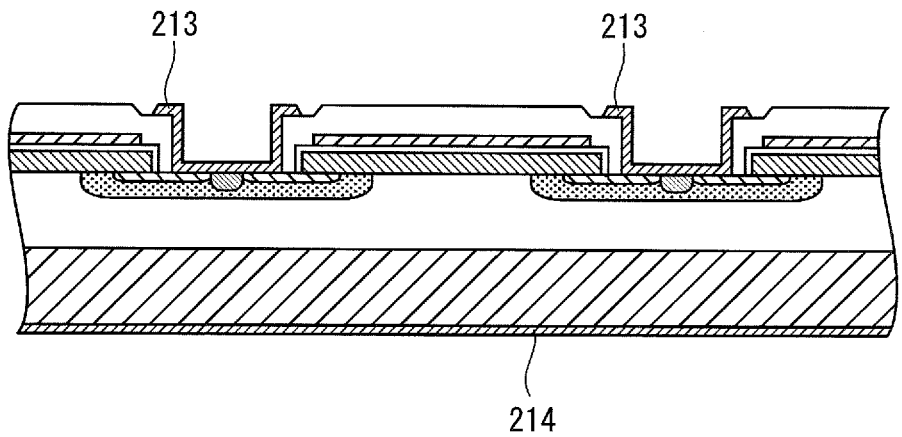

Thereafter, a nickel film or the like having a thickness of approximately 50 nm is formed over the interlayer insulation films 227. As shown in FIG. 17C, the nickel film is then removed by etching, except for parts of the nickel film that are located inside and around the vias 235. After the etching is performed, the source electrodes 213 made of nickel silicide are formed by making the remaining parts of the nickel film react with the silicon carbide surface by, for example, performing a heat treatment at 950° C. for five minutes in an inert atmosphere. The drain electrode 214 is formed on the back surface of the $n^+$ substrate 210 by, for example, similarly depositing nickel across the entire back surface of the $n^+$ substrate 210 and making the deposited nickel react with silicon carbide by heat treatment.

Thereafter, the source wiring 226 is formed by depositing an aluminum layer having a thickness of approximately 4 μm over the interlayer insulation films 227 and the vias 235, and etching the deposited aluminum layer in a predetermined pattern. Finally, gate wiring is formed at an edge of the semiconductor chip so that the gate wiring is in contact with the gate electrodes 212, and Ti/Ni/Ag is deposited on the back surface of the drain electrode 214 as the back surface electrode 228 for die bonding. Consequently, the semiconductor element 2000 illustrated in FIG. 10 is obtained.

[Modification Example of Second Embodiment]

Figure 18:
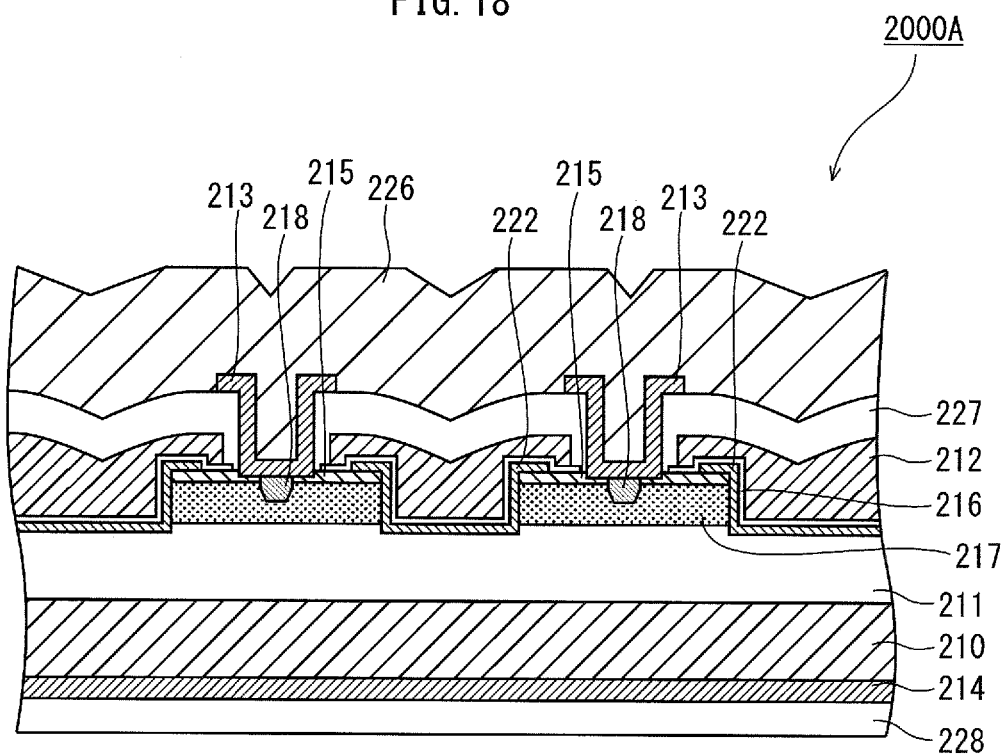
FIG. 18 is a schematic cross-sectional view showing the structure of a semiconductor element 2000A pertaining to a modification example of Second Embodiment.

FIG. 18 is a schematic cross-sectional view showing the structure of a semiconductor element 2000A pertaining to a modification example of Second Embodiment.

The semiconductor element 2000 pertaining to Second Embodiment has a so-called vertical planar MISFET structure. On the other hand, the semiconductor element 2000A illustrated in FIG. 18 has a vertical trench MISFET structure. When a semiconductor element constituting each switch has the vertical trench MISFET structure, advantageous effects equivalent to the above-described advantageous effects can be achieved. Note that in FIG. 18, constituent elements that are the same as those shown in FIG. 10 have the same reference signs thereas.

<Method for Manufacturing Semiconductor Element 2000A>

The following describes a method for manufacturing the semiconductor element 2000A with reference to FIG. 18 and FIGS. 19A through 22B.

Figure 19A:
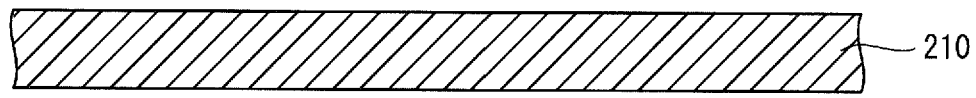
FIGS. 19A through 19C show one example of a method for manufacturing the semiconductor element 2000A pertaining to the modification example of Second Embodiment.
Figure 19B:
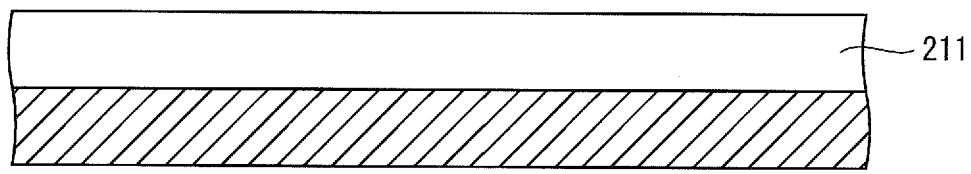
Figure 19C:
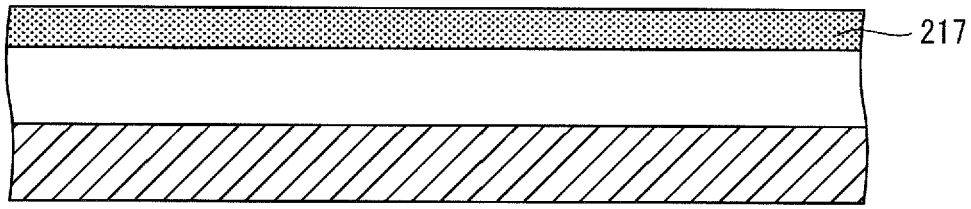

First of all, as shown in FIG. 19A, the $n^+$ substrate 210 is prepared. For example, an n-type off-cut 4H—SiC substrate having low resistance may be used as the $n^+$ substrate 210. Next, as shown in FIG. 19B, the $n^-$ drift layer 211 having high resistance is formed on the $n^+$ substrate 210 by epitaxial growth. For example, n-type 4H—SiC may be used as the $n^-$ drift layer 211. Thereafter, as shown in FIG. 19C, the p-type body region 217 having a thickness of, for example, approximately 0.5 μm to 1 μm is formed on the front surface of the $n^-$ drift layer 211 by epitaxial growth.

Figure 20A:
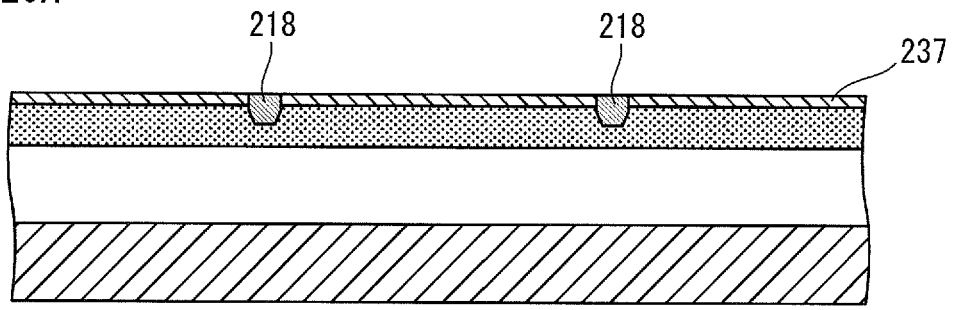
FIGS. 20A through 20C show one example of a method for manufacturing the semiconductor element 2000A pertaining to the modification example of Second Embodiment.
Figure 20B:
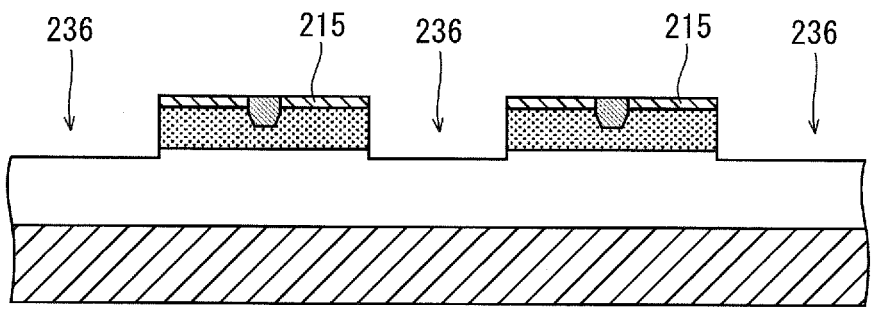
Figure 20C:
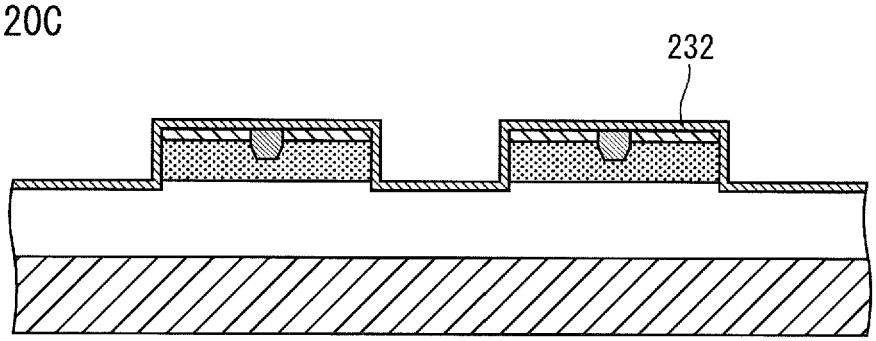

Subsequently, as shown in FIG. 20A, a highly-concentrated $n^+$ semiconductor region 237 is formed either by injecting nitrogen ions or the like above a front surface of the p-type body region 217, or by epitaxial growth. Next, the p-type contact regions 218 are formed by injecting aluminum (Al) ions, boron (B) ions, or the like, in such a manner that the p-type contact regions 218 penetrate all through the $n^+$ semiconductor region 237 into the p-type body region 217. Thereafter, activation annealing is performed. Then, as shown in FIG. 20B, trenches 236 and $n^+$ source regions 215 are formed at desired locations by dry-etching silicon carbide with use of a mask (not illustrated). The trenches 236 are recesses that penetrate all through the $n^+$ source regions 215 and the p-type body region 217 into the $n^-$ drift layer 211. Subsequently, as shown in FIG. 20C, the epitaxial layer 232 is epitaxially grown with use of silicon carbide at locations including the lateral surfaces of the trenches 236. Note that the epitaxial layer 232 may be structured such that the concentration of impurities therein changes along a direction of the thickness thereof.

Figure 21A:
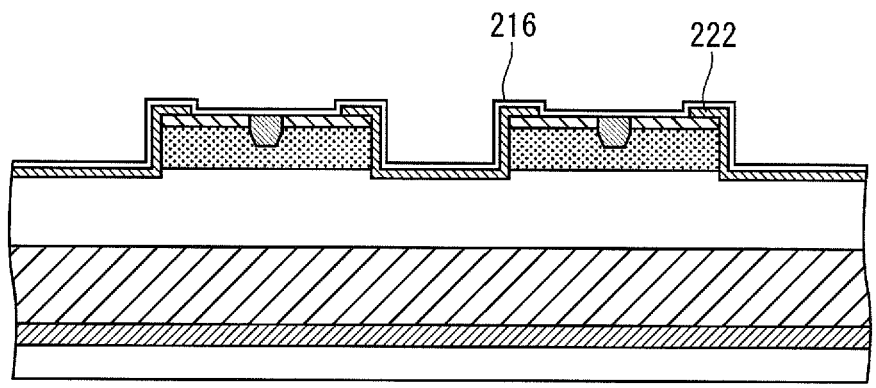
FIGS. 21A and 21B show one example of a method for manufacturing the semiconductor element 2000A pertaining to the modification example of Second Embodiment.
Figure 21B:
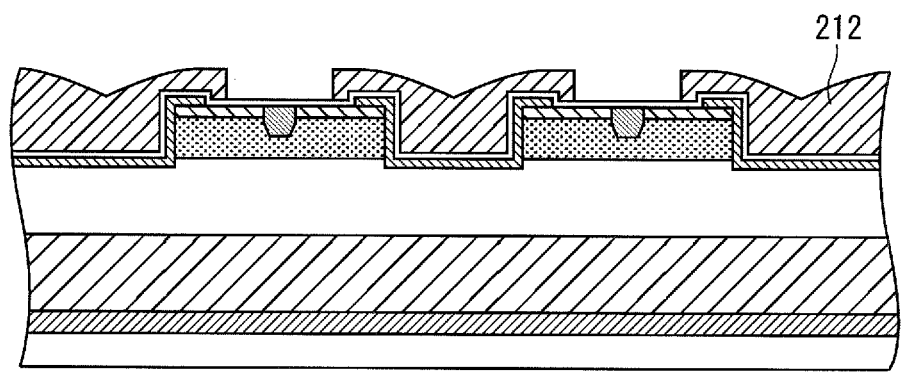

Then, as shown in FIG. 21A, channel layers 222 are formed by dry-etching the epitaxial layer 232. Next, the gate insulation film 216 is formed by thermally oxidizing front surfaces of the channel layers 222. Thereafter, as shown in FIG. 21B, a polycrystalline silicon film 233 that is doped with phosphorus (P) and has a thickness of approximately 500 nm is deposited on a front surface of the gate insulation film 216, and the gate electrodes 212 are formed by dry-etching the deposited polycrystalline silicon film 233 in a desired pattern.

Figure 22A:
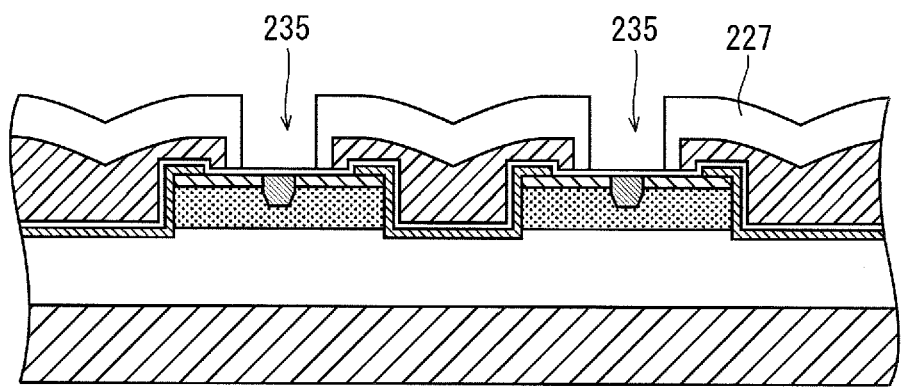
FIGS. 22A and 22B show one example of a method for manufacturing the semiconductor element 2000A pertaining to the modification example of Second Embodiment.
Figure 22B:
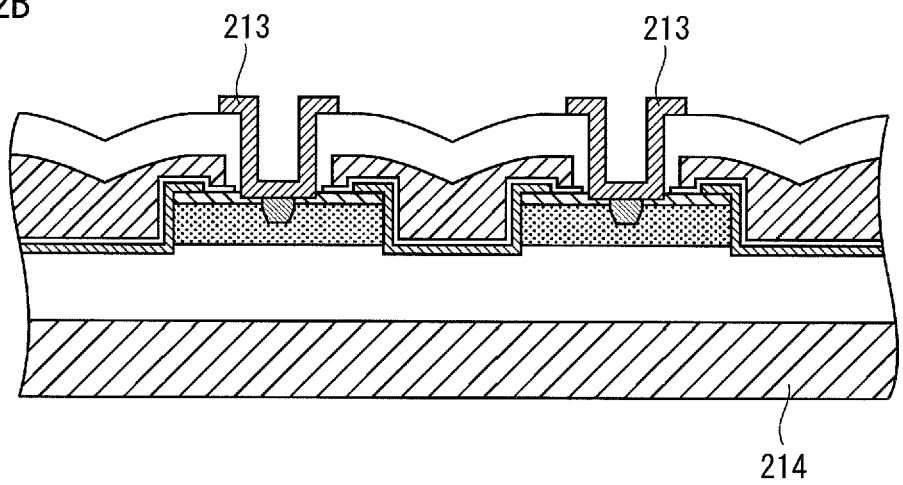

Subsequently, as shown in FIG. 22A, $SiO_2$ layers having a thickness of approximately 1.5 μm are deposited on front surfaces of the gate electrodes 212. Next, interlayer insulation films 227 and vias 235 are formed by performing dry etching with use of a mask (not illustrated). Thereafter, a nickel film or the like having a thickness of approximately 50 nm is formed over the interlayer insulation films 227. As shown in FIG. 22B, the nickel film is then removed by etching, except for parts of the nickel film that are located inside and around the vias 235. After the etching is performed, the source electrodes 213 made of nickel silicide are formed by making the remaining parts of the nickel film react with the silicon carbide surface by, for example, performing a heat treatment at 950° C. for five minutes in an inert atmosphere. The drain electrode 214 is formed on the back surface of the $n^+$ substrate 210 by, for example, similarly depositing nickel across the entire back surface of the $n^+$ substrate 210 and making the deposited nickel react with silicon carbide by heat treatment.

Subsequently, the source wiring 226 illustrated in FIG. 18 is formed by depositing an aluminum layer having a thickness of approximately 4 μm over the interlayer insulation films 227 and the vias 235, and etching the deposited aluminum layer in a predetermined pattern. Finally, gate wiring is formed at an edge of the semiconductor chip so that the gate wiring is in contact with the gate electrodes 212, and Ti/Ni/Ag is deposited on the back surface of the drain electrode 214 as the back surface electrode 228 for die bonding Consequently, the semiconductor element 2000A illustrated in FIG. 18 is obtained.

Third Embodiment

The present embodiment provides a description of a gate drive circuit structured such that a short circuit current is more difficult to flow between switches.

Figure 23A:
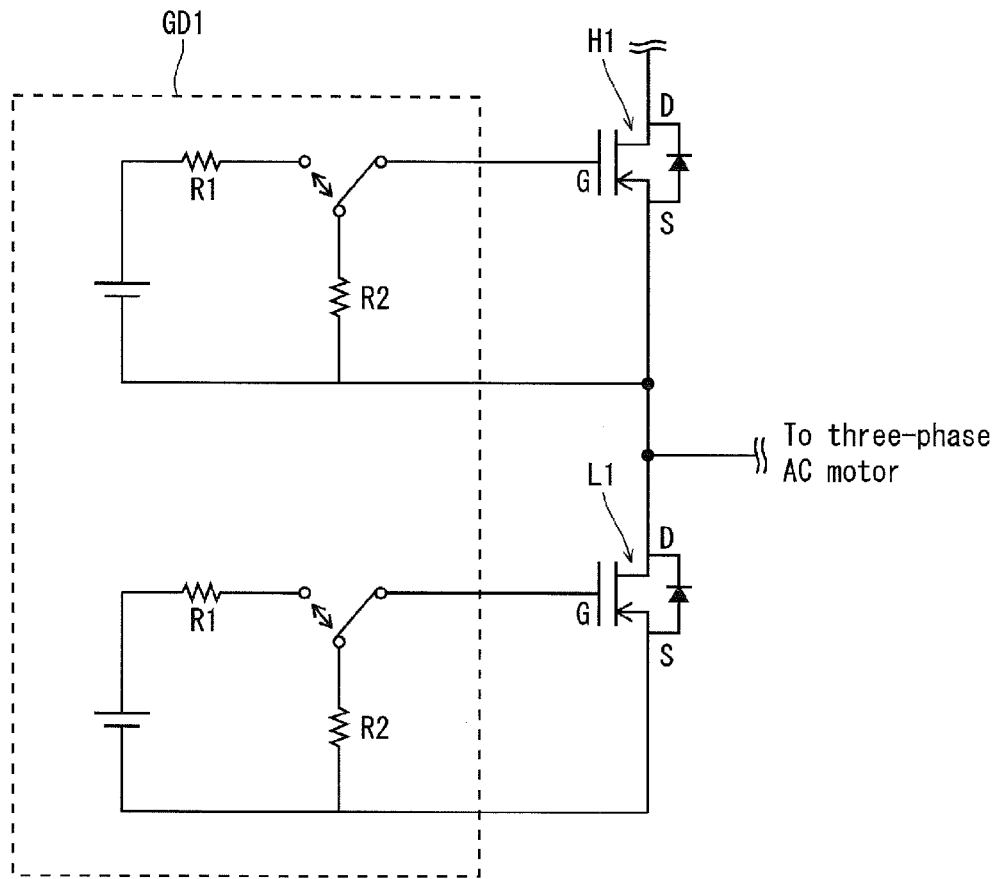
FIG. 23A shows a circuit structure of a gate drive circuit pertaining to Third Embodiment.
Figure 23B:
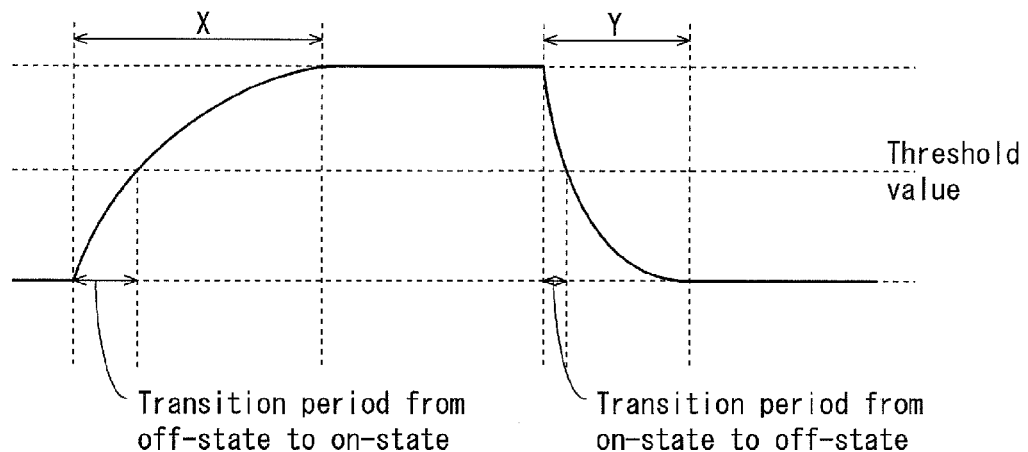
FIG. 23B shows fluctuations in a terminal-to-terminal voltage of each switch during the switching operation.

FIG. 23A shows a circuit structure of a gate drive circuit pertaining to the present embodiment. FIG. 23B shows fluctuations in a terminal-to-terminal voltage of each switch during the switching operation. Note that the reference signs of constituent elements shown in FIG. 23A are basically the same as the reference signs of constituent elements shown in FIG. 1. Although the following description relates only to the high-side switch, the same goes for the low-side switch.

A description is now given of the switching operation performed by the switch with reference to FIGS. 23A and 23B, with a focus on charge and discharge of a gate capacitance between the gate electrode and the source electrode of the switch (hereinafter, simply "a gate capacitance of the switch").

As shown in FIG. 23B, in an interval X, the gate capacitance of the switch is charged with power supplied from the direct current power supply DC, and the terminal-to-terminal voltage of the switch gradually increases. When the terminal-to-terminal voltage exceeds a threshold value indicated by a dotted line, the switch performs a switching operation to switch from the off-state to the on-state. Thereafter, the terminal-to-terminal voltage of the switch keeps increasing. When charging of the gate capacitance of the switch is completed, the increase in the terminal-to-terminal voltage ceases.

On the other hand, in an interval Y, the power that has charged the gate capacitance of the switch is released (the gate capacitance is discharged), and the terminal-to-terminal voltage of the switch gradually decreases. When the terminal-to-terminal voltage becomes equal to or lower than the threshold value indicated by the dotted line, the switch performs a switching operation to switch from the on-state to the off-state. Thereafter, the terminal-to-terminal voltage of the switch keeps decreasing. When the discharge of the gate capacitance of the switch is completed, the decrease in the terminal-to-terminal voltage ceases.

As shown in FIG. 23A, a resistance R1 is disposed on a path through which the power from the direct current power supply DC is supplied during the interval X. Similarly, a resistance R2 is disposed on a path through which the gate capacitance of the switch is discharged during the interval Y. This way, the lengths of the intervals X and Y can be changed by changing the resistance values of the resistances R1 and R2.

It is possible to prevent a short circuit current from flowing between the switches by making a transition period from the off-state to the on-state longer than a transition period from the on-state to the off-state. That is to say, when the resistance value of the resistance R1 is set to be larger than the resistance value of the resistance R2, a short circuit current is more difficult to flow between the switches. It goes without saying that the structure of the gate drive circuit shown in FIG. 23A is applicable to both First and Second Embodiments.

Figure 24A:
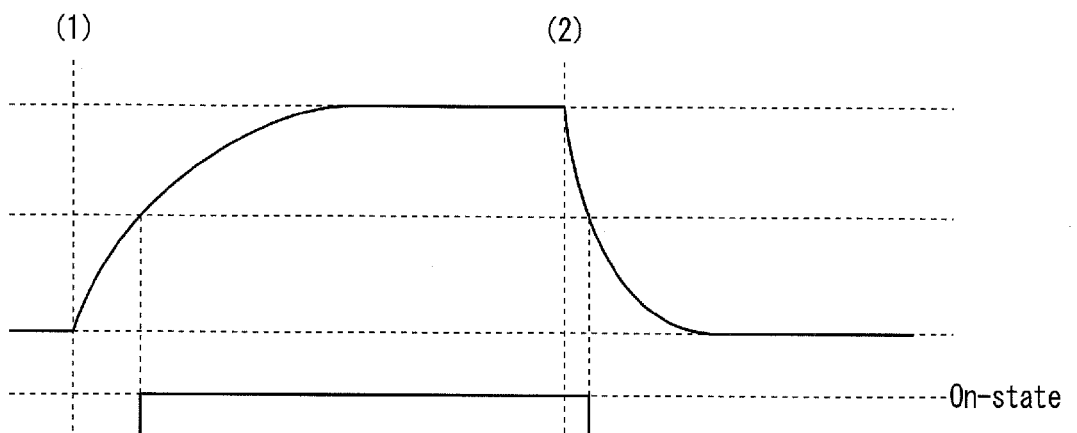
FIG. 24A shows fluctuations in a terminal-to-terminal voltage of a high-side switch during the switching operation.
Figure 24B:
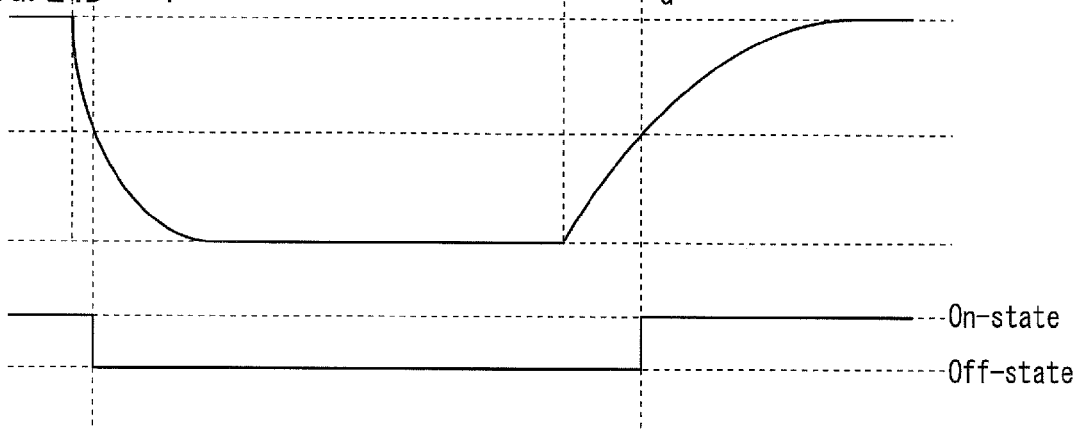
FIG. 24B shows fluctuations in a terminal-to-terminal voltage of a low-side switch during the switching operation.

FIGS. 24A and 24B show fluctuations in the terminal-to-terminal voltage of each switch during the switching operation, in correspondence with the state of each switch during the switching operation. Note, FIGS. 24A and 24B depict a case where the structure of the present embodiment is applied. FIGS. 24A and 24B respectively show the high-side switch and the low-side switch. As indicated by time (1) in FIGS. 24A and 24B, the time at which the terminal-to-terminal voltage starts to rise in FIG. 24A coincides with the time at which the terminal-to-terminal voltage starts to fall in FIG. 24B. Similarly, as indicated by time (2) in FIGS. 24A and 24B, the time at which the terminal-to-terminal voltage starts to fall in FIG. 24A coincides with the time at which the terminal-to-terminal voltage starts to rise in FIG. 24B. It is assumed here that the gate drive signals are not provided with any dead times in such a case where the time at which the terminal-to-terminal voltage of one switch starts to rise coincides with the time at which the terminal-to-terminal voltage of the other switch starts to fall. When the structure of the present embodiment is applied, there are time periods F and G in which both of the high-side switch and the low-side switch are in the off-state. However, when the switches constituted by the semiconductor element pertaining to First or Second Embodiment are used, a recovery current hardly flows as mentioned above, and therefore the problems caused by use of the semiconductor element pertaining to Patent Literature 2 does not occur.

Fourth Embodiment

As has been described above, the structure of a gate drive circuit can be simplified by providing no dead time in gate drive signals. The present embodiment explains a specific example of such a gate drive circuit with a simplified structure.

Figure 25A:
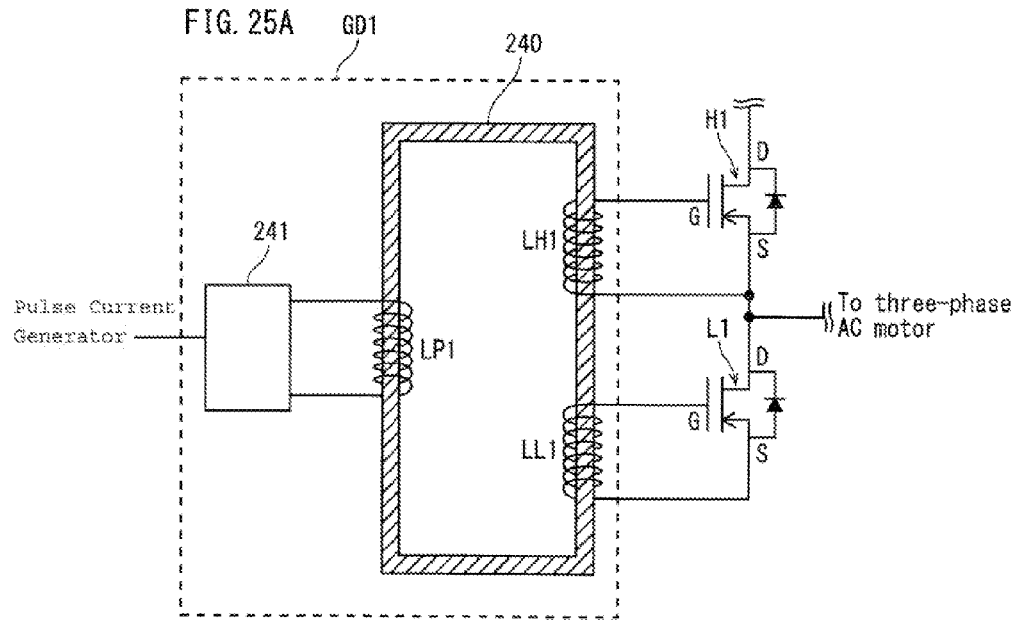
FIGS. 25A and 25B show a circuit structure of a gate drive circuit pertaining to Fourth Embodiment.
Figure 25B:
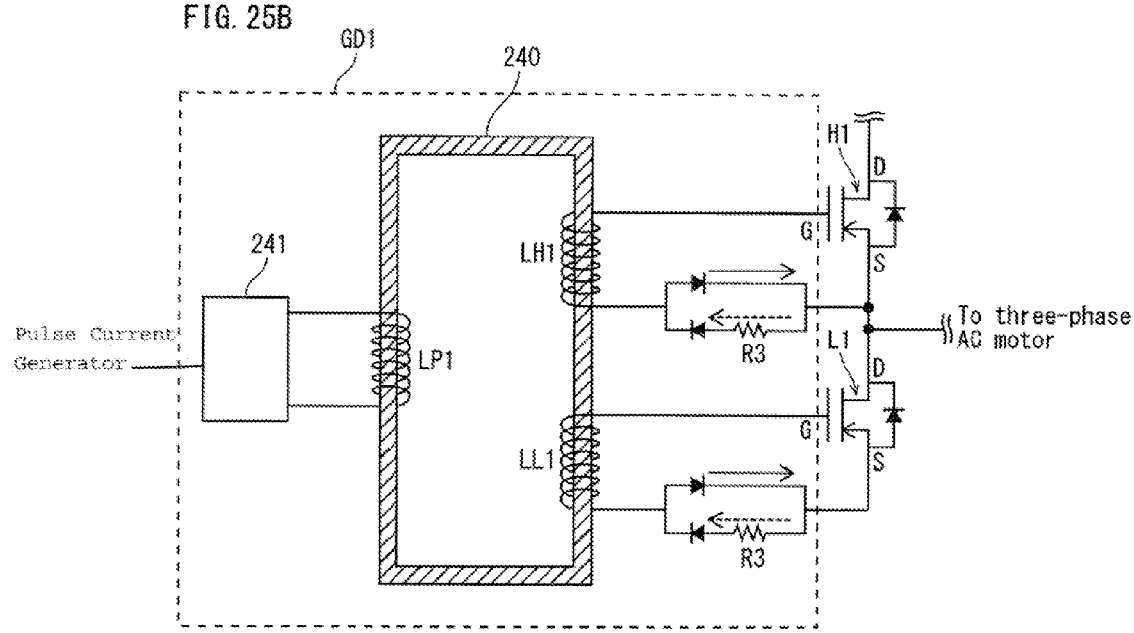

FIGS. 25A and 25B show a circuit structure of a gate drive circuit pertaining to the present embodiment. Note that the reference signs of constituent elements shown in FIGS. 25A and 25B are basically the same as the reference signs of constituent elements shown in FIG. 1. Although the following description relates only to the high-side switch, the same goes for the low-side switch.

The gate drive circuit GD1 shown in FIG. 25A includes a pulse transformer 240 and a pulse current generator 241.

The pulse transformer 240 is composed of a primary coil LP1, a first secondary coil LH1 and a second secondary coil LL1. A pulse current output from the pulse current generator 241 is applied to the primary coil LP1. The first secondary coil LH1 applies the gate drive signal SgH1 to a gate electrode of the high-side switch H1. The second secondary coil LL1 applies the gate drive signal SgL1 to a gate electrode of the low-side switch L1.

As a result of passing the pulse current from the pulse current generator 241 to the primary coil LP1 of the pulse transformer 240, the gate drive signals SgH1 and SgL1 are supplied to the high-side switch and the low-side switch via the secondary coils LH1 and LL1. The waveform of the gate drive signal SgL1 can be inverted with respect to the waveform of the gate drive signal SgH1 by winding the second secondary coil LL1 in the opposite direction from the direction in which the first secondary coil LH1 is wound.

FIG. 25B shows a gate drive circuit with a simplified structure in which a short circuit current is more difficult to flow between the switches. As shown in FIG. 25B, a resistance R3 is disposed on a path via which the gate capacitance of each switch is charged with power supplied from the direct current power supply DC. On the other hand, no resistance is disposed on a path via which the gate capacitance of each switch is discharged. With this circuit structure, the transition period from the off-state to the on-state can be made longer than the transition period from the on-state to the off-state. As a result, it is possible to prevent a short circuit current from flowing between the switches.

With the gate drive circuit pertaining to the present embodiment, there is no need to make detailed settings for the timing chart of the switching operation. This allows simplification of control. Furthermore, it is possible to perform control on the switches as long as one gate drive circuit is provided for each of the three-phase arms. This allows reducing the volume of components mounted in the inverter. It goes without saying that the structure of the gate drive circuit shown in FIGS. 25A and 25B is applicable to both First and Second Embodiments.

Experiments have confirmed that the inverter normally operates with the above structure.

The present invention has been described above based on First to Fourth Embodiments. However, the present invention is not limited to these embodiments. For example, the following modification examples are applicable.

MODIFICATION EXAMPLES (1) SBD described in First Embodiment exhibits desired properties as long as the n⁻ drift layer is provided with the Schottky electrode. Therefore, SBD could be arranged at various locations. For example, it is permissible to process a portion of the n⁻ drift layer so that SBD can be arranged at the processed portion of the n⁻ drift layer. Furthermore, it is not necessary to provide one SBD to one MISFET region. Alternatively, one SBD may be provided to a plurality of MISFET regions.

(2) In a case where SBD described in First Embodiment is used as a freewheeling diode, proper selection of metal used for the Schottky electrode results in a smaller voltage drop in the forward direction and enhanced suppression of conduction losses.

(3) In the above embodiments, a freewheeling diode is not provided separately from the MISFET. However, when a required load current is larger than the current capacity of the channel diode, a freewheeling diode element may be provided separately from the MISFET. In this case, the load current flows through both of the channel diode and the separately-provided freewheeling diode element. As such, the current capacity of the freewheeling diode element can be made smaller than that of a conventional freewheeling diode element. This structure enables reduction in the area of a chip of the freewheeling diode element and in the cost.

(4) The structure of switches for implementing the present invention is not limited to those described in the above embodiments.

(5) FIGS. 10 and 11 illustrate, as an example, the semiconductor element 2000 in which the channel layers 222 are formed on the front surface of the n⁻ drift layer 211. However, the present invention is not limited to such an example. Alternatively, the front surfaces of the channel layers 222 may be flush with the front surfaces of the n⁺ source regions 215 and the p-type contact regions 218. Put another way, the channel layers 222 may be embedded in the n⁻ drift layer 211. Such a semiconductor element can be manufactured by, for instance, performing the following steps in the stated order: forming the p-type body regions 217; forming the channel layers 222; and forming the n⁺ source regions 215 and the p-type contact regions 218.

(6) First Embodiment has described the structure of the semiconductor element 1000 that does not include the channel layers included in the semiconductor element 2000 pertaining to Second Embodiment. However, the present invention is not limited to such a structure. The semiconductor element 1000 pertaining to First Embodiment may include channel layers. In this case, regions of the channel layers that are located above the p-type body regions 117 function as channel regions.

(7) The present description has been given under the assumption that majority carriers are electrons, minority carriers are electron holes, a first conductive type recited in the claims is an n-type, and a second conductive type recited in the claims is a p-type. However, the same principle applies to the case of reverse polarity, namely, when majority carriers are electron holes, minority carriers are electrons, a first conductive type recited in the claims is a p-type, and a second conductive type recited in the claims is an n-type.

(8) In the present description, the controller is realized by a microcontroller unit (MCU), a microcomputer, or the like. On the other hand, the gate drive circuit is realized by an integrated circuit (IC) or the like.

(9) The drawings show the positional relations among constituent elements only schematically to the extent that the present invention is comprehensible. Hence, the present invention should not be limited to the examples shown in the drawings. It should also be noted that some constituent elements are omitted from the drawings so as to facilitate the understanding of the drawings.

(10) The above embodiments and modification examples are merely desirable examples. Therefore, the present invention is not limited to the above embodiments and modification examples. Optionally, the configurations described in the above embodiments and modification examples may be combined in a suitable manner.

INDUSTRIAL APPLICABILITY

The present invention is suitable for an inverter for which a size reduction is required.

REFERENCE SIGNS LIST 100, 200, 900: load driving system
101, 201, 901: inverter
102, 902: smoothing capacitor
103, 903: three-phase AC motor
104$u$, 204$u$, 904$u$: U-phase arm
104$v$, 204$v$, 904$v$: V-phase arm
104$w$, 204$w$, 904$w$: W-phase arm
105: controller
110, 210, 910: n⁺ SiC substrate
111, 211, 911: n⁻ drift layer
112, 212, 912: gate electrode
113, 213, 913: source electrode
114, 214, 914: drain electrode
115, 215, 915: n⁺ source region
116, 216, 916: gate insulation film
117, 217, 917: p-type body region
119: Schottky electrode
120: Schottky barrier diode (SBD)
121, 221, 921: JFET region
142: MISFET region
143: diode region
1000, 2000, 2000A, 9000: semiconductor element
218: p-type contact region
222: channel layer
223: channel region
224: path through which reverse current flows in channel diode
225, 925: body diode
226: source wiring
227: interlayer insulation film
228: back surface electrode
230: mask
231: Al or B ions
232: epitaxial layer
233: polycrystalline silicon film
234: SiO₂ layer
235: via
236: trench
237: n⁺ semiconductor region
240: pulse transformer
241: pulse current generator
242: MISFET region

504: boost converter
604: buck-boost converter
DC: direct current power supply
H1, H2, H9: high-side switch
L1, L2, L9: low-side switch
DH1, DL1, DH2, DL2, DH9, DL9: freewheeling diode
GD1, GD2, GD91, GD92: gate drive circuit
IH1: current flowing through high-side switch in forward direction
IL1: current flowing through low-side switch in reverse direction
ID1: current flowing through diode region in reverse direction
DT1, DT2: dead time
LP1: primary coil
LH1: first secondary coil
LL1: second secondary coil
R1, R2, R3: resistance
Pw: PWM signal

The invention claimed is:

1. An inverter comprising:
a circuit including N arms connected in parallel, N being an integer equal to or greater than two, each of the N arms including a first switch and a second switch connected in series, each of the first switch and the second switch being a metal-insulator-semiconductor field-effect transistor including a gate for controlling a switching operation; and
N gate drive circuits corresponding one-to-one to the N arms and configured to control, by pulse-width modulation using synchronous rectification, each of the first switch and the second switch to switch to an on-state or an off-state, wherein
each metal-insulator-semiconductor field-effect transistor includes:
a channel region that is conductive in both a forward direction and a reverse direction in the on-state, and that is not conductive in the forward direction in the off-state;
a diode region that is combined as one with the channel region, and that is conductive only in the reverse direction, the diode region being unipolar; and
a body diode,
each gate drive circuit synchronizes a timing at which the gate drive circuit outputs a signal for causing the first switch to switch to the on-state with a timing at which the gate drive circuit outputs a signal for causing the second switch to switch to the off-state, and synchronizes a timing at which the gate drive circuit outputs a signal for causing the first switch to switch to the off-state with a timing at which the gate drive circuit outputs a signal for causing the second switch to switch to the on-state,
a threshold voltage of each metal-insulator-semiconductor field-effect transistor is Vth, and
an electric potential of each gate based on an electric potential of a source of the metal-insulator-semiconductor field-effect transistor is Vgs,
an electric potential of a drain of the metal-insulator-semiconductor field-effect transistor based on the electric potential of the source is Vds,
when the relations Vgs≥Vth and Vds≥0 are both satisfied, a current flows from the drain to the source via the channel region,
when the relations Vgs≥Vth and Vds<0 are both satisfied, a current flows from the source to the drain via the channel region,
when the relations Vgs<Vth and Vds≥0 are both satisfied, there is no conduction between the source and the drain,
when the relation 0≤Vgs<Vth is satisfied and Vds is lower than a predetermined voltage, a current flows from the source to the drain via the channel region, and
when the current flows from the source to the drain via the channel region with the relation 0≤Vgs<Vth satisfied, an absolute value of an on-voltage for the metal-insulator-semiconductor field-effect transistor is smaller than an absolute value of an on-voltage for the body diode.

2. The inverter of claim 1, wherein
each gate drive circuit generates a first drive signal and a second drive signal in accordance with a single input signal, the first drive signal being for driving the first switch, and the second drive signal being for driving the second switch and having a waveform that is the inverse of a waveform of the first drive signal.

3. The inverter of claim 2, wherein
each gate drive circuit includes a pulse transformer, and
the pulse transformer includes:
a primary coil to which the input signal is applied;
a first secondary coil that applies the first drive signal to the first switch; and
a second secondary coil that applies the second drive signal to the second switch.

4. The inverter of claim 1, wherein
each switch switches to the on-state by the gate drive circuit charging a capacitance of the gate of the switch,
each switch switches to the off-state by the gate drive circuit discharging the capacitance of the gate of the switch, and
for each switch, due to a resistance value of a first resistance contained in a circuit involving the charge being larger than a resistance value of a second resistance contained in a circuit involving the discharge, a time period the switch requires to switch to the off-state is shorter than a time period the switch requires to switch to the on-state.

5. The inverter of claim 1, wherein
each switch switches to the on-state by the gate drive circuit charging a capacitance of the gate of the switch,
each switch switches to the off-state by the gate drive circuit discharging the capacitance of the gate of the switch, and
for each switch,
a diode is contained in both of a circuit involving the charge and a circuit involving the discharge, and
due to the circuit involving the charge further containing a resistance connected in series to the diode, a time period the switch requires to switch to the off-state is shorter than a time period the switch requires to switch to the on-state.

6. The inverter of claim 1, wherein
each metal-insulator-semiconductor field-effect transistor is a metal-oxide-semiconductor field-effect transistor.

7. The inverter of claim 1, wherein
each metal-insulator-semiconductor field-effect transistor includes:
a semiconductor substrate of a first conductive type;
a drift layer of the first conductive type, arranged on a main surface of the semiconductor substrate;
a body region of a second conductive type, arranged on the drift layer;
a source region of the first conductive type, arranged to be in contact with the body region;

a channel layer of the first conductive type, arranged to be in contact with at least a part of the drift layer, a part of the body region, and a part of the source region;
a gate insulation film arranged on the channel layer;
the gate arranged on the gate insulation film;
the source arranged on the source region; and
the drain arranged on a back surface of the semiconductor substrate opposite to the main surface of the semiconductor substrate.

8. The inverter of claim 1, wherein
each switch is constituted by a wide bandgap semiconductor.

9. The inverter of claim 1, wherein
each switch has one of a rated voltage of 100 V or more, and a rated current of 10 A or more.

10. The inverter of claim 1, wherein
the switching operation of each switch is controlled by using the pulse-width modulation in accordance with a pulse-width modulation signal that is obtained by comparing a carrier signal and a control command signal having a sinusoidal waveform.

* * * * *